US012176338B2

(12) United States Patent
Tsai et al.

(10) Patent No.: US 12,176,338 B2
(45) Date of Patent: Dec. 24, 2024

(54) SEMICONDUCTOR DEVICE, METHOD OF AND SYSTEM FOR MANUFACTURING SEMICONDUCTOR DEVICE

(71) Applicant: TAIWAN SEMICONDUCTOR MANUFACTURING COMPANY, LTD., Hsinchu (TW)

(72) Inventors: Wei-Hsin Tsai, Hsinchu (TW); Hui-Zhong Zhuang, Hsinchu (TW); Chih-Liang Chen, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/519,486

(22) Filed: Nov. 27, 2023

(65) Prior Publication Data

US 2024/0096865 A1  Mar. 21, 2024

Related U.S. Application Data

(63) Continuation of application No. 17/390,108, filed on Jul. 30, 2021, now Pat. No. 11,855,070.

(51) Int. Cl.
H01L 27/02      (2006.01)
H01L 21/8238    (2006.01)
H01L 23/522     (2006.01)
H01L 27/092     (2006.01)

(52) U.S. Cl.
CPC .. *H01L 27/0207* (2013.01); *H01L 21/823871* (2013.01); *H01L 23/5226* (2013.01); *H01L 27/092* (2013.01)

(58) Field of Classification Search
CPC ............... H01L 27/0207; H01L 27/092; H01L 21/823871; H01L 23/5226
USPC .......................................................... 257/369
See application file for complete search history.

(56) References Cited

U.S. PATENT DOCUMENTS

| 7,260,442 | B2 | 8/2007 | Hwang et al. |
| 9,256,709 | B2 | 2/2016 | Yu et al. |
| 11,476,207 | B2* | 10/2022 | Lee ........................ H01L 29/78 |
| 2014/0040838 | A1 | 2/2014 | Liu et al. |
| 2015/0278429 | A1 | 10/2015 | Chang |
| 2018/0366535 | A1 | 12/2018 | Chong et al. |
| 2020/0042668 | A1 | 2/2020 | Peng et al. |

* cited by examiner

Primary Examiner — Tu-Tu V Ho
(74) Attorney, Agent, or Firm — Hauptman Ham, LLP

(57) ABSTRACT

A semiconductor device, includes a first metal layer, a second metal layer, a drain/source contact and at least one conductive via. The first metal layer has a first conductor that extends in a first direction and a second conductor that extends in the first direction, wherein the second conductor is directly adjacent to the first conductor. The second metal layer has a third conductor that extends in a second direction, wherein the second direction is transverse to the first direction. The drain/source contact extends in the second direction and is connected to the second conductor. The at least one conductive via connects the first conductor and the second conductor through the third conductor.

20 Claims, 16 Drawing Sheets

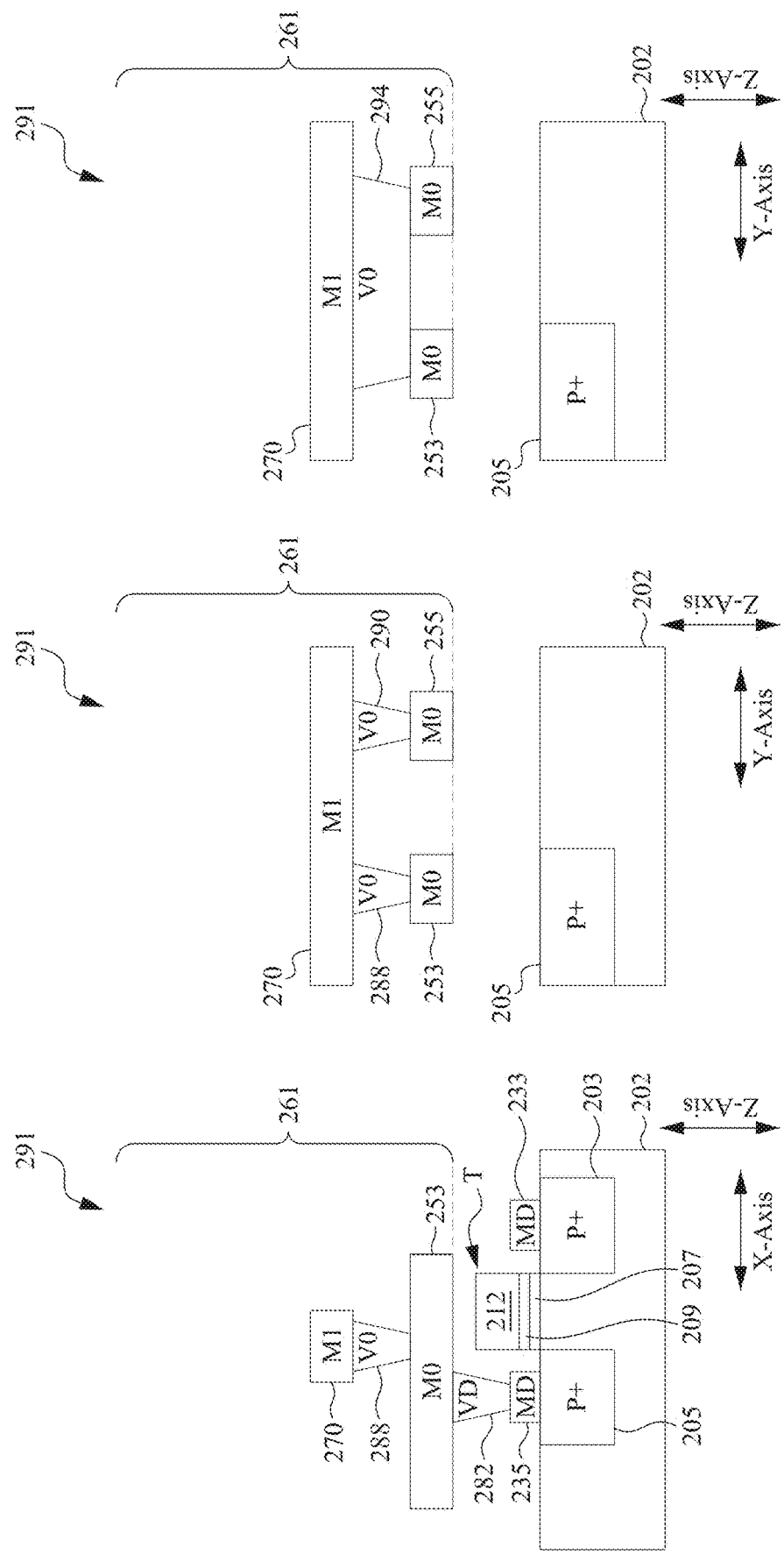

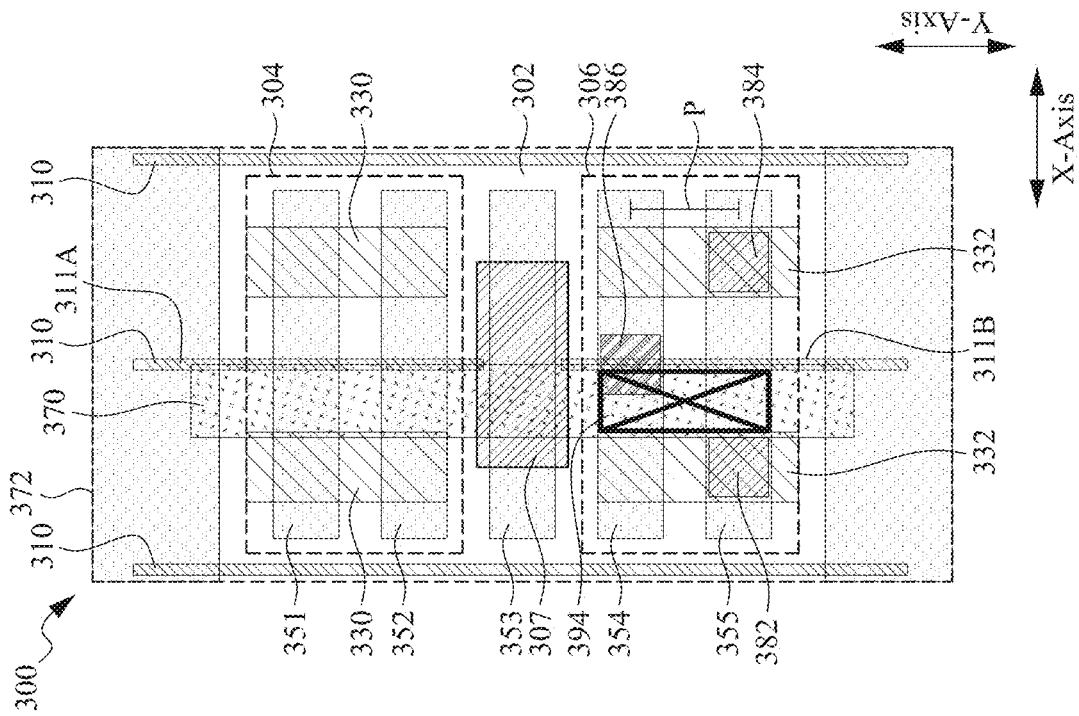
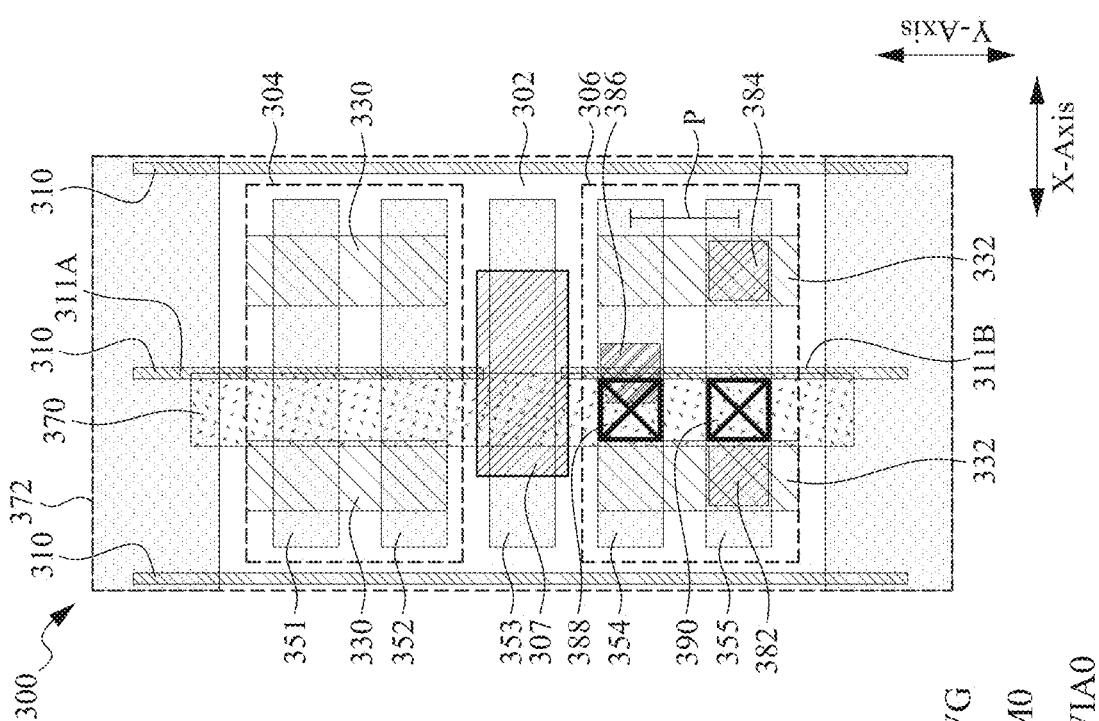

800

702
generate a layout diagram

802
generate an M0 layer in the layout diagram that includes a first conductor region that extends in a first direction and a second conductor region that extends in the first direction, wherein the second conductor is directly adjacent to the first conductor;

804
generate an M1 layer that includes a third conductor region that extends in a second direction, wherein the second direction is transverse to the first direction

806
generate, in a VIA0 layer, a first conductive via region that connects the first conductor region to the third conductor region and a second conductive via region that connects the second conductor region to the third conductor region

704
based on the layout diagram,
fabricating one or more components of a semiconductor device

810
depositing and patterning a first metal layer to obtain a plurality of conductors extending in a first direction, wherein the plurality of conductors are spaced at a pitch in a second direction, and wherein the plurality of conductors comprises a first conductor and a second conductor which are spaced from each other at the pitch in the second direction

812
etching and depositing at least one conductive via over and in electrical contact with the first conductor and the second conductor

814
depositing and patterning a second metal layer to obtain a third conductor that extends in the second direction, wherein the second direction is transverse to the first direction, and wherein the third conductor is over and in electrical contact with the at least one conductive via to electrically connect the first conductor and the second conductor.

Fig. 8B

SEMICONDUCTOR DEVICE, METHOD OF AND SYSTEM FOR MANUFACTURING SEMICONDUCTOR DEVICE

RELATED APPLICATION(S)

The instant application is a continuation application of U.S. patent application Ser. No. 17/390,108, filed Jul. 30, 2021, the disclosure of which is hereby incorporated by reference in its entirety.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization. Routing and placing is where the different devices in a device are connected. One of the goals of routing and placing in a layout is to reduce the amount of routing required and thereby improve power and space consumed by a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a schematic cross-sectional view, taken along line C-C in FIG. 2A, of a semiconductor device in accordance with some embodiments.

FIG. 2D is a schematic cross-sectional view, taken along line D-D in FIG. 2A, of a semiconductor device in accordance with some embodiments.

FIG. 2E is a schematic cross-sectional view, taken along line E-E in FIG. 2B, of a semiconductor device in accordance with some embodiments.

FIG. 3A is a schematic view of a layout diagram of a circuit region, in accordance with some embodiments.

FIG. 3B is a schematic view of a layout diagram of another circuit region, in accordance with some embodiments.

FIG. 8A is a flowchart of a method of generating a layout diagram, in accordance with some embodiments.

FIG. 8B is a method of fabricating a semiconductor device based on a layout diagram, in accordance with some embodiments.

DETAILED DESCRIPTION

Figure 1:
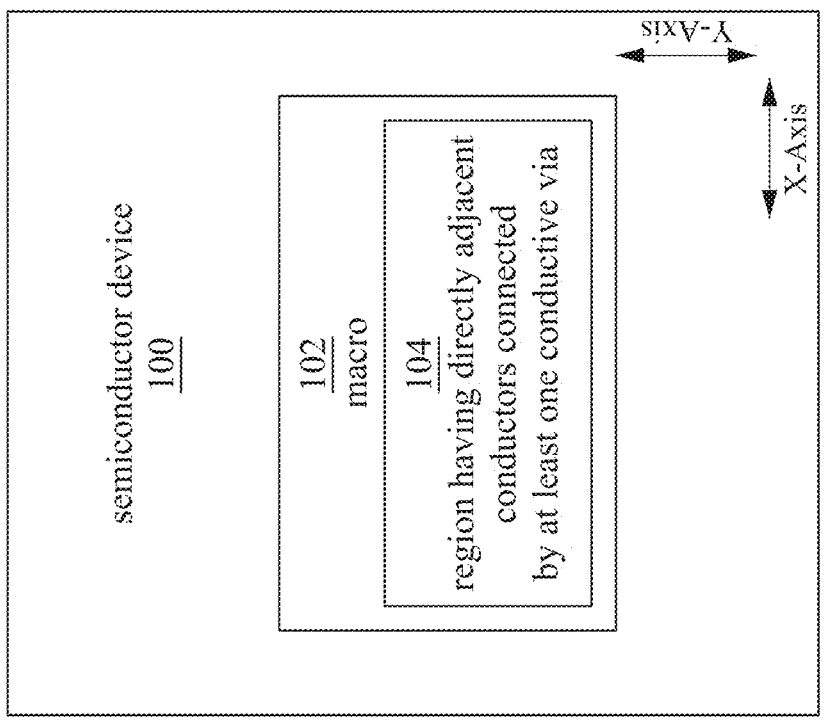
FIG. 1 is a block diagram of a semiconductor device, in accordance with at least one embodiment.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device provides conductors in a metal layer that all extend in a first direction. In one example, the conductors in the M0 metal layer of a semiconductor device are all formed to define a long axis that extends in a direction parallel to the X-axis. To connect adjacent pairs of these conductors, another conductor in a second metal layer is formed in a second direction that is transverse to the first direction. In one example, a conductor is formed in the M1 metal layer of a semiconductor that extends in a direction parallel to the Y-axis. At least one conductive via is used to connect the adjacent pair of conductors to the conductor in the second metal layer. In one example, one conductive via connects one of the adjacent conductors in the M0 metal layer with the conductor in the M1 metal layer and another conductive via connects the other adjacent conductor in the M0 metal layer with the conductor in the M1 meal layer. In another example, an elongated slot via connects the adjacent pair of conductors in the M0 metal layer with the conductor in the M1 metal layer. In at least one embodiment, this provides a spatially efficient technique for connecting adjacent conductors. As such, this can reduce at least one of the area, power, or capacitance in a circuit.

FIG. 1 is a block diagram of a semiconductor device 100, in accordance with at least one embodiment.

In FIG. 1, semiconductor device 100 includes, among other things, a macro 102. In some embodiments, a macro 102 is a memory, a power grid, a cell or cells, an inverter, a latch, a buffer and/or any other type of circuit arrangement that may be represented digitally in a cell library. In some embodiments, circuit macro 102 is understood in the context of an analogy to the architectural hierarchy of modular programming in which subroutines/procedures are called by a main program (or by other subroutines) to carry out a given computational function. In this context, semiconductor device 100 uses circuit macro/module 102 to perform one or more given functions. Accordingly, in this context and in terms of architectural hierarchy, semiconductor device 100 is analogous to the main program and macro (hereinafter, macro) 102 is analogous to subroutines/procedures. In some embodiments, macro 102 is a soft macro. In some embodiments, macro 102 is a hard macro. In some embodiments, macro 102 is a soft macro which is described/couched digitally in register-transfer level (RTL) code. In some embodiments, synthesis, placement and routing have yet to have been performed on macro 102 such that the soft macro can be synthesized, placed and routed for a variety of process nodes. In some embodiments, macro 102 is a hard macro which is described/couched digitally in a binary file format (e.g., Graphic Database System II (GDSII) stream format), where the binary file format represents planar geometric shapes, text labels, other information and the like of one or more layout-diagrams of macro 102 in hierarchical form. In some embodiments, synthesis, placement and routing have been performed on macro 102 such that the hard macro is specific to a particular process node.

The macro 102 includes a region 104, which has directly adjacent conductors connected by a further conductor and at least one conductive via. In some embodiments, the region 104 include a semiconductor substrate having active regions that extend in a first direction (e.g., parallel to an X-axis). Furthermore, above and/or below the semiconductor substrate the region 104 may have various metal layers that are stacked over and/or under insulating layers to form a Back End of Line (BEOL). The BEOL provides routing for the semiconductor device, including the macro 102 and region 104. In some embodiments, the metal layers are provided to form conductors that extend in the first direction or in a second direction (e.g., parallel to the Y-axis) transverse to the first direction. In some embodiments, the first direction is orthogonal to the second direction. Furthermore, in some embodiments, each metal layer may form conductors that extend in only either the first direction (i.e., have a long axis that extends in the first direction) or the second direction (i.e., have a long axis that extends in the second direction). A minimum spacing between conductors that are directly adjacent to one another may be defined by a pitch, which is a minimum center to center spacing (relative to the long-axis) between adjacent conductors. The region 104 includes at least one directly adjacent pair of conductors within at least one metal layer that are connected by at least one conductive via.

Figure 2A:
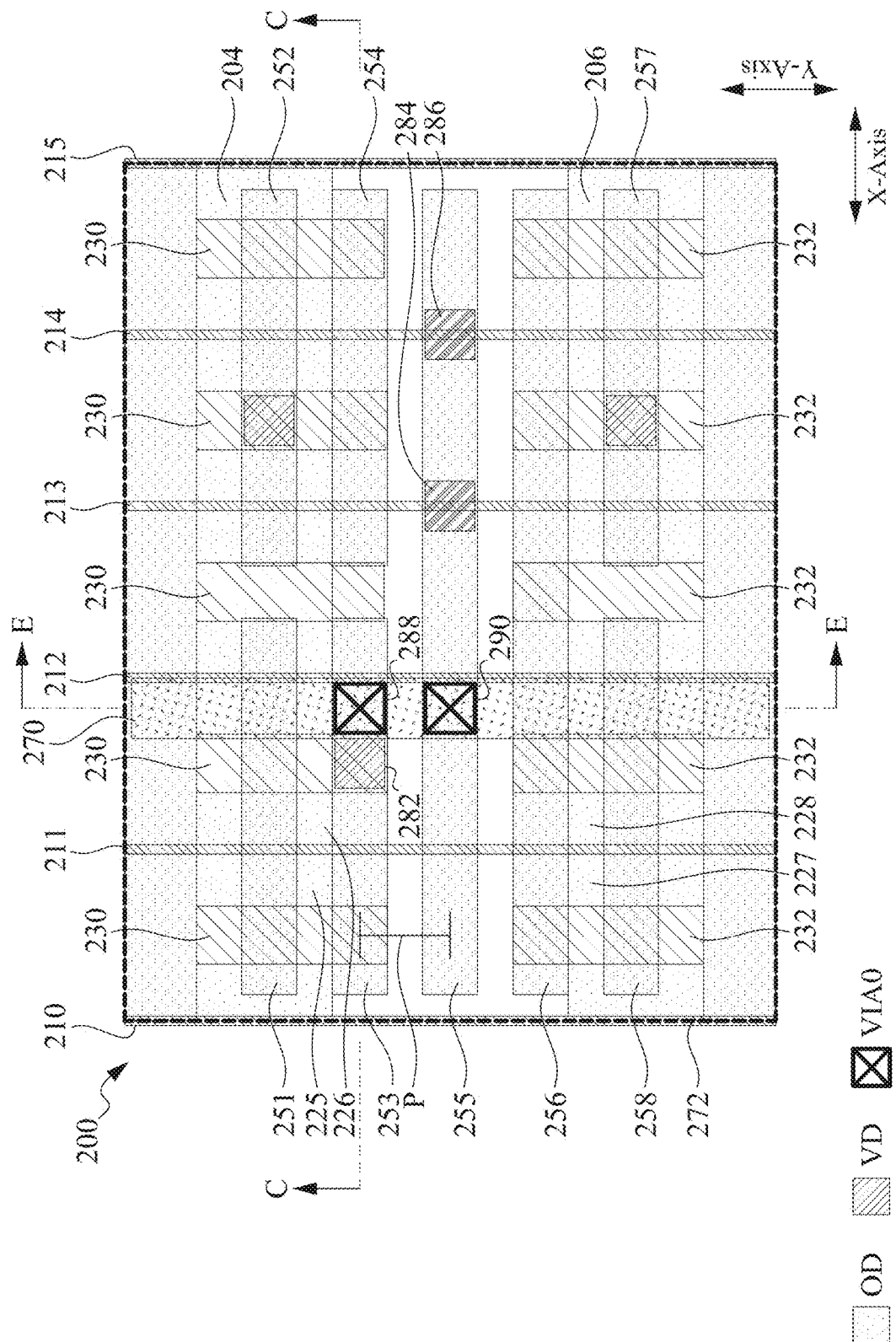
FIG. 2A is a schematic view of a layout diagram of a circuit region, in accordance with some embodiments.

FIG. 2A is a schematic view of a layout diagram of a circuit region 200, in accordance with some embodiments. In at least one embodiment, region 200 is an example of region 104 in FIG. 1. In the example shown in FIG. 2A, the region 200 includes a semiconductor substrate 202, a first active region 204, a second active region 206, gate electrodes 210, 211, 212, 213, 214, 215, drain/source contacts 230, 232, conductors 251, 252, 253, 254, 255, 256, 257, 258 that are formed in a first metal layer, a conductor 270 that is formed in a second metal layer, and a boundary 272. The first active region 204 and the second active region 206 are arranged inside the boundary 272, and extend along a first direction, i.e., parallel to the X axis. Active regions are provided as and are sometimes referred to as oxide-definition (OD) regions. A direction parallel to the X axis is sometimes referred to as the OD direction. The first active region 204 and the second active region 206 include P-type dopants and/or N-type dopants to form one or more circuit elements or devices. In this example embodiment, the first active region 204 includes a P-type dopant and the second active region 206 includes an N-type dopant. The active regions 204, 206 are formed within the semiconductor substrate 202. Examples of circuit elements that may be formed include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, P-channel and/or N-channel field effect transistors (PFETs/NFETs), etc.), FinFETs, planar MOS transistors with raised source/drains, nanosheet FETs, nanowire FETs, or the like. Note that the active regions 204, 206 are not contiguous and are separated by a displacement in the second direction. Accordingly, in at least one embodiment, circuits formed with these regions do not require dummy diodes or transistors.

Gate electrodes 210, 211, 212, 213, 214, 215 each have a long axis that extends in a second direction (i.e., parallel to the Y-axis) that is transverse to the first direction. In at least one embodiment, the first direction is orthogonal to the second direction. In this example embodiment, five drain/source contacts 230 are formed on portions of the PMOS active region 204 that provide drain/source regions and five drain/source contacts 232 are formed on portions of the NMOS active region 206 that form drain/source regions. The drain/source contacts 230, 232 are formed from an MD metal layer that is directly above the active regions 204, 206. The PMOS active region 204 is configured to form four PMOS transistors. The first PMOS transistor includes gate electrode 211 and a pair of drain/source contacts 230 that are directly adjacent to and on oppositely disposed sides of the gate electrode 211 relative to the first direction. With regards to the first PMOS transistor, the first PMOS transistor includes a pair of drain/source regions 225, 226 directly adjacent to and on oppositely disposed sides of the gate electrode 211. The drain/source regions 225, 226 are formed from the active region 204 on oppositely disposed sides of the gate electrode 211. Other PMOS transistors in this disclosure have the same arrangement for their drain/source regions with respect to their gate electrode (or gate electrode portion-see below) and the active region from which the PMOS transistor is formed. Additionally, a second PMOS transistor includes gate electrode 212 and a pair of drain/source contacts 230 that are directly adjacent to and on oppositely disposed sides of the gate electrode 212 relative to the first direction. Furthermore, a third PMOS transistor includes gate electrode 213 and a pair of drain/source contacts 230 that are directly adjacent to and on oppositely disposed sides of the gate electrode 213 relative to the first direction. Finally, a fourth PMOS transistor includes gate electrode 214 and a pair of drain/source contacts 230 that are directly adjacent to and on oppositely disposed sides of the gate electrode 214 relative to the first direction.

The NMOS active region 206 is configured to form four NMOS transistors. A first NMOS transistor that includes gate electrode 211 and a pair of drain/source contacts 232 that are directly adjacent to and on oppositely disposed sides of the gate electrode 211 relative to the first direction. With regards to the first NMOS transistor, the first NMOS transistor includes a pair of drain/source regions 227, 228 directly adjacent to and on oppositely disposed sides of the gate electrode 211. The drain/source regions 227, 228 are formed from the active region 206 on oppositely disposed sides of the gate electrode 211. The drain/source regions 227, 228 are also of an opposite doping type in comparison to the drain/source regions 225, 226. Other NMOS transistors in this disclosure have the same arrangement for their drain/source regions with respect to their gate electrode (or gate electrode portion-see below) and the active region from which the PMOS transistor is formed. Additionally, a second NMOS transistor that includes gate electrode 212 and a pair of drain/source contacts 232 that are directly adjacent to and on oppositely disposed sides of the gate electrode 212 relative to the first direction. A third NMOS transistor includes gate electrode 213 and a pair of drain/source contacts 232 that are directly adjacent to and on oppositely disposed sides of the gate electrode 213 relative to the first direction. Finally, a fourth NMOS transistor that includes gate electrode 214 and a pair of drain/source contacts 232 that are directly adjacent to and on oppositely disposed sides of the gate electrode 214 relative to the first direction. The gate electrodes 210, 215 are each oppositely disposed at oppositely disposed Y-extending edges of the boundary 272 of the region 200. In this example embodiment, the PMOS active region 204 and the NMOS active region 206 are not contiguous and are separated by a section of the substrate 202.

In this example embodiment, all of the conductors 251, 252, 253, 254, 255, 256, 257, 258 each define a long axis that extends in the first direction and are provided in the M0 metal layer. The M0 metal layer is the lowermost metal layer in the BEOL. The conductors 251, 252, 253, 254, 255, 256, 257, 258 are all spaced apart from each other in the second direction by a pitch P. Furthermore, adjacent conductors 251, 252, 253, 254, 255, 256, 257, 258 are spaced in accordance with a pitch P (the pitch P is shown once in FIG. 2A for the sake of clarity) relative to the second direction. Accordingly, the conductor 253 extend in the first direction and the conductor 255 extend in the first direction. Both the conductor 253 and the conductor 255 are directly adjacent to one another and are therefore spaced at the pitch P in the second direction. No other conductor in the M0 metal layer is arranged between the conductor 253 and the conductor 255 in the second direction.

The conductor 253 and the conductor 255 are connected to one another. More specifically, a second metal layer includes a conductor 270 to connect the conductor 253 and the conductor 255. In this example, the second metal layer is an M1 metal layer that is formed over the M0 metal layer. The M1 metal layer is the second lowest metal layer in the BEOL and is thus directly above the M0 metal layer. The conductor 270 defines a long axis that extends in the second direction. In this example embodiment, the conductor 270 is formed in the M1 metal layer. The conductor 270 extends over the adjacent pair of conductors 253, 255. In this example, the conductor 253 extends over the drain/source contact 230 adjacent to and to the left of the gate electrode 212 of the second PMOS transistor. A conductive contact 282 in a conductive via layer VD connects to the drain/source contact 230 (adjacent to and to the left of the gate electrode 212 of the second PMOS transistor) to the conductor 253. The conductive via layer VD is provided beneath the M0 layer and above the MD layer and thus the conductive via layer VD is above the drain/source contacts 230, 232. A conductive contact 284 in a conductive via layer VG connects the gate electrode 213 of the third PMOS transistor to the conductor 255, and a conductive contact 286 in the conductive via layer VG connects the gate electrode 214 of the fourth PMOS transistor to the conductor 255. The conductive via layer VG is provided beneath the M0 layer and above the PO (polysilicon) layer, wherein the gate electrodes 210, 211, 212, 213, 214, 215 are all formed in the PO layer. The PO layer is provided below the M0 layer and above the active regions 230, 232. A direction parallel to the Y direction is sometimes referred to as the Poly direction.

In order to connect the drain/source contact 230 adjacent to and to the left of the gate electrode 212 of the second PMOS transistor to the gate electrode 213 of the third PMOS transistor and to the gate electrode 214 of the fourth PMOS transistor, a conductive via 288 connects the conductor 253 to the conductor 270 and a conductive via 290 connects the conductor 255 to the conductor 270. The conductive via 288 and the conductive via 290 are both provided in the conductive via layer VIA0, which is above the metal layer M0 and below the metal layer M1. The route for connection is thus the drain/source contact 230 adjacent to and to the left of the gate electrode 212, the conductive contact 282 in the conductive via layer VD, the conductor 253 in the M0 metal layer, the conductive via 288 in the conductive via layer VIA0, the conductor 270 in the metal layer M1, the conductive via 290 in the conductive via layer VIA0, the conductor 255 in the metal layer M0, and either the conductive contact 284 in the VG layer to the gate electrode 213 in the PO layer or the conductive contact 286 in the VG layer to the gate electrode 214 in the PO layer. Accordingly, in at least one embodiment, by connecting adjacent pairs of the conductors 253, 255 in the described manner, different components are connectable without requiring a circuitous route as in other approaches. In this case, the drain/source contact 230 adjacent to and to the left of the gate electrode 212 of the second PMOS transistor is connected to the gate electrodes 213, 214 of the third and fourth PMOS transistors without requiring an overly circuitous path. This allows for the region 200, in at least one embodiment, to have at least one of a better power performance, a smaller area, or increased routing flexibility.

Figure 2B:
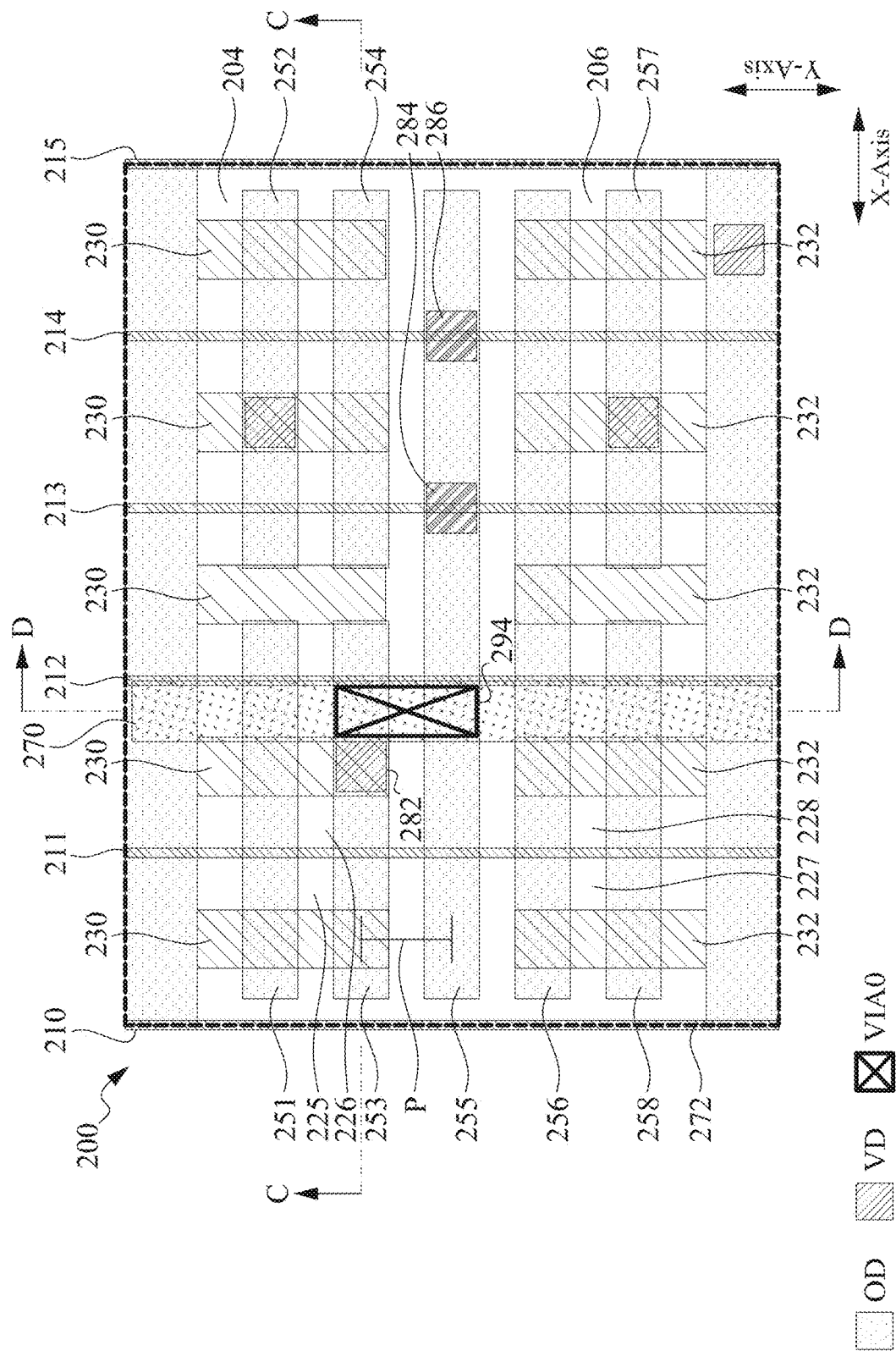
FIG. 2B is a schematic view of a layout diagram of another circuit region, in accordance with some embodiments.

FIG. 2B is a schematic view of a layout diagram of another circuit region 292, in accordance with some embodiments. The circuit region 292 is the same as circuit region 200 in FIG. 2A (like element numbers are to like components) except that the circuit region 292 does not include the conductive via 288 and the conductive via 290. Instead, in this example embodiment, the circuit region 292 has an elongated conductive via (also referred to herein as "conductive slot via") 294 in the conductive via layer VIA0 that connects the conductor 253 and the conductor 255 to the conductor 270. In some embodiments, the elongated conductive via 294 is rectangular and has a long axis that extends in a second direction to a distance at least equal to the separation between the conductor 253 and the conductor 255. In this manner, the elongated conductive via 294 defines a long axis that connects the conductors 253, 255 to the conductor 270. In this specific embodiment, the elongated conductive via 294 has a long axis that is equal to the pitch P added to one half the width of the conductor 253 added to one half the width of the conductor 255. In this specific embodiment, the elongated conductive via 294 also define a short axis in the first direction equal to the width of the conductor 270. In this manner, the elongated conductive via 294 minimizes the contact resistance between the conductors 253, 255, 270. In some embodiments, the long axis of the elongated conductive via may be provided in any other suitable distance and the short axis may be provided in any other suitable distance.

FIG. 2C is a schematic cross-sectional view, taken along line C-C in FIG. 2A, of a semiconductor device 291 corresponding to the circuit region 200 in accordance with some embodiments. FIG. 2C shows a portion of the semiconductor device 291 corresponding to an area around the gate electrode 212 in the circuit region 200. The cross-section line C-C in FIG. 2A extends along the X axis. Corresponding components in FIG. 2A and FIG. 2C are indicated by the same reference numerals. In at least one embodiment, the semiconductor device 291 corresponds to the semiconductor device 100.

As shown in FIG. 2C, the semiconductor device 291 comprises a substrate 202 over which circuitry corresponding to the circuit region 200 is formed. N-type and/or P-type dopants are added to the substrate 202 to correspondingly form N wells and/or P wells. For example, P wells 203, 205 are shown in FIG. 2C. In some embodiments, isolation structures are formed between adjacent wells. For simplicity, several features such as N wells and isolation structures are omitted from FIG. 2C. In at least one embodiment, the P wells 203, 205 define drain/source regions of a transistor T, and are referred to herein as drain/source regions 203, 205. A gate region of the transistor T comprises a stack of gate dielectric layers 207, 209, and the gate electrode 212. In at least one embodiment, the transistor T comprises a gate dielectric layer instead of multiple gate dielectrics. Example materials of the gate dielectric layer or layers include HfO2, ZrO2, or the like. Example materials of the gate electrode 212 include polysilicon, metal, or the like. The transistor T is an example of a circuit element in the semiconductor device 291. Contact structures for electrically coupling the transistor T to other circuit elements in the semiconductor device 291 comprise drain/source contacts 233, 235 correspondingly over and in electrical contact with the drain/source regions 203, 205, and a conductive via (not shown) over and in electrical contact with the gate electrode 212. The drain/source contacts 233, 235 are also referred to as metal-to-device (MD) contacts. The drain/source contacts 233, 235 in FIG. 2C correspond to the drain/source contacts 230 on the left and right sides of the gate electrode 212 in FIG. 2A. The conductive contact 282 in a conductive via layer VD (via-to-device) is over and in electrical contact with the drain/source contact 235. An interconnect structure 261 is over the conductive via layer VD, and comprises a plurality of metal layers M0, M1, . . . and a plurality of via layers VIA0 (indicated as V0 in FIG. 2C), VIA1 (indicated as V1 in FIG. 2C), . . . arranged alternatingly in a thickness direction of the substrate 202, i.e., along a Z axis. The interconnect structure 261 further comprises various inter-layer dielectric (ILD) layers (not shown) in which the metal layers and via layers are embedded. The metal layers and via layers of the interconnect structure 261 are configured to electrically couple various elements or circuits of the semiconductor device 291 with each other, and with external circuitry. For example, the drain/source region 205 of the transistor T is electrically coupled to the conductor 253 in the M0 layer through the drain/source contact 235 and the conductive contact 282. The conductive via 288 in the V0 layer is over and in electrical contact with the conductor 253. The conductor 270 in the M1 layer is over and in electrical contact with the conductive via 288.

FIG. 2D is a schematic cross-sectional view, taken along line D-D in FIG. 2A, of the semiconductor device 291 corresponding to the circuit region 200 in accordance with some embodiments. FIG. 2D shows a portion of the semiconductor device 291 corresponding to an area around the conductors 253, 255 in the circuit region 200. The cross-section line D-D in FIG. 2A extends along the Y axis. Corresponding components in FIG. 2A and FIG. 2D are indicated by the same reference numerals.

As shown in FIG. 2D, the conductor 270 is over and in electrical contact with the conductive via 290, which in turn is over and in electrical contact with the conductor 255 in the M0 layer. As a result, the conductor 270 in the M1 layer electrically connects the conductors 253, 255 in the M0 layer through the corresponding conductive vias 288, 290 in the V0 layer, as described with respect to FIG. 2A. In at least one embodiment, the interconnect structure 261 comprises one or more further conductors and/or conductive vias in one or more corresponding metal layers and/or via layers above the M1 layer to electrically connect various elements or circuits of the semiconductor device 291 with each other, and with external circuitry. The described structure is an example. Other configurations are within the scopes of various embodiments.

FIG. 2E is a schematic cross-sectional view, taken along line E-E in FIG. 2B, of a semiconductor device 293 corresponding to the circuit region 292 in accordance with some embodiments. FIG. 2E shows a portion of the semiconductor device 293 corresponding to an area around the gate electrode 212 in the circuit region 292. A schematic cross-sectional view, taken along line C-C in FIG. 2B, of the semiconductor device 293 is similar to FIG. 2C. The cross-section line E-E in FIG. 2B extends along the Y axis. Corresponding components in FIGS. 2B, 2D and 2E are indicated by the same reference numerals. In at least one embodiment, the semiconductor device 293 corresponds to the semiconductor device 100.

The semiconductor device 293 in FIG. 2E is similar to the semiconductor device 291 in FIG. 2D. A difference is that the conductive vias 288, 290 in the semiconductor device 291 in FIG. 2D are replaced with the elongated conductive via 294 in the semiconductor device 293 in FIG. 2E. The elongated conductive via 294 is over and in electrical contact with both the conductors 253, 255. The conductor 270 is over and in electrical contact with the elongated conductive via 294. As a result, the conductor 270 in the M1 layer electrically connects the conductors 253, 255 in the M0 layer through the elongated conductive via 294 in the V0 layer, as described with respect to FIG. 2B. The described structure is an example. Other configurations are within the scopes of various embodiments.

In some embodiments, each conductor in the M0 layer has a width y along the Y axis, each conductive via in the V0 layer has a dimension y along the Y axis and along the X axis, and a spacing along the Y axis between directly adjacent conductive vias in the V0 layer or between directly adjacent conductors in the M0 layer is x. In at least one embodiment, the ratio x:y is from 1:0.5 to 1:2. For example, in FIG. 2A, each of the conductors 253, 255 has a width y along the Y axis, each of the conductive vias 288, 290 has a dimension y along the Y axis and along the X axis, and a spacing along the Y axis between directly adjacent conductive vias 288, 290 is x. In some embodiments, the spacing x between the conductive vias 288, 290 is 10 nm, and the dimension of each of the conductive vias 288, 290 along the X axis and the Y axis is from 5 nm to 20 nm. For a further example, in FIG. 2B, the elongated conductive via 294 has a width y along the X axis, and a length of (x+2y), or from 2x to 5x, along the Y axis. A middle part of the elongated conductive via 294 having an area of xy will land on Shallow Trench Isolation (STI) or ILD between the conductors 253, 255. In some embodiments, the spacing x between the conductors 253, 255 is 10 nm, and the length of the elongated conductive via 294 along the Y axis is from 20 nm to 50 nm. The described specific dimensions are examples. Other configurations are within the scopes of various embodiments.

FIG. 3A is a schematic view of a layout diagram of a circuit region 300, in accordance with some embodiments. In at least one embodiment, the circuit region 300 is an example of region 104 in FIG. 1. In the example of FIG. 3A, the region 300 includes a semiconductor substrate 302, a first active region 304, a second active region 306, gate electrodes 310, 311, 312, drain/source contacts 330, 332, conductors 351, 352, 353, 354, 355 that are formed in a first metal layer, a conductor 370 that is formed in a second metal layer and a boundary 372. The first active region 304 and the second active region 306 are arranged inside the boundary 372, and extend along a first direction, i.e., parallel to the X axis. Active regions 304, 306 are oxide-definition (OD) regions in the semiconductor substrate 302. The first active region 304 and the second active region 306 include P-type dopants and/or N-type dopants to form one or more circuit elements or devices. In this example embodiment, the first active region 304 includes a P-type dopant and the second active region 306 includes an N-type dopant. The active regions 304, 306 are formed within the semiconductor substrate 302. Note that the active regions 304, 306 are not contiguous and are separated by a displacement in the second direction. Note that in this example embodiment, a cut polysilicon (CPO) portion 307 is provided to separate the gate electrode 311 into a first gate electrode portion 311A and a second gate electrode portion 311B. Accordingly, circuits formed with these regions do not require dummy diodes or transistors.

Gate electrodes 310, 311, 312, each have a long axis that extends in a second direction (i.e., parallel to the Y-axis) that is transverse to the first direction. In at least one embodiment, the first direction is orthogonal to the second direction. In this example embodiment, two drain/source contacts 330 are formed on the PMOS active region 304 and two drain/source contacts 332 are formed on the NMOS active region 306. The PMOS active region 304 is configured to form one PMOS transistor that includes the first gate electrode portion 311A and a pair of drain/source contacts 330 that are directly adjacent to and on oppositely disposed sides of the first gate electrode portion 311A relative to the first direction. The NMOS active region 306 is configured to form an NMOS transistor that includes second gate electrode portion 311B and a pair of drain/source contacts 332 that are directly adjacent to and on oppositely disposed sides of the second gate electrode portion 311B relative to the first direction. The CPO portion 307 thereby provides isolation between the PMOS transistor and the NMOS transistor. The gate electrodes 310, 312 are each oppositely disposed at oppositely disposed Y-extending edges of the boundary 372 of the region 300. In this example embodiment, the PMOS active region 304 and the NMOS active region 306 are not contiguous and are separated by a section of the substrate 302.

In this example embodiment, all of the conductors 351, 352, 353, 354, 355, each define a long axis that extends in the first direction and are provided in the M0 metal layer. The conductors 351, 352, 353, 354, 355, are all spaced apart from each other in the second direction by a pitch P. Thus, adjacent conductors 351, 352, 353, 354, 355, are spaced in accordance with a pitch P (the pitch P is only shown once in FIG. 3A for the sake of clarity) relative to the second direction. Accordingly, the conductor 354 extend in the first direction and the conductor 355 extend in the first direction. Both the conductor 354 and the conductor 355 are directly adjacent to one another and are therefore spaced at the pitch P in the second direction. No other conductor in the M0 metal layer is arranged between the conductor 354 and the conductor 355 in the second direction.

The conductor 354 and the conductor 355 are connected to one another. More specifically, a second metal layer includes a conductor 370 that connects the conductor 354 and the conductor 355. In this example, the second metal layer is an M1 metal layer that is formed over the M0 metal layer. The conductor 370 defines a long axis that extends in the second direction. In this example embodiment, the conductor 370 is formed in the M1 metal layer. The conductor 370 extends over the adjacent pair of conductors 353, 355. In this example, the conductor 354 extends over the drain/source contact 332 adjacent to and to the left of the first gate electrode 311B of the NMOS transistor. A conductive contact 382 in a conductive via layer VD connects to the drain/source contact 332 (adjacent to and to the left of the second gate electrode portion 311B of the NMOS transistor) to the conductor 355. Another conductive contact 384 in a conductive via layer VD connects to the other drain/source contact 332 (adjacent to and to the right of the second gate electrode portion 311B of the NMOS transistor) to the conductor 355. The conductive via layer VD is provided beneath the M0 layer and above the MD layer that forms the drain/source contacts 330, 332. A conductive contact 386 in a conductive via layer VG connects the second gate electrode portion 311B of the NMOS transistor to the conductor 354. The conductive via layer VG is provided beneath the M0 layer and above the PO layer, wherein the gate electrodes 310, 311, 312, are all formed in the PO layer. The PO layer is provided below the M0 layer and above the active regions 330, 332.

In order to connect the drain/source contacts 332 and the second gate electrode portion 311B of the NMOS transistor, a conductive via 388 connects the conductor 354 to the conductor 370 and a conductive via 390 connects the conductor 355 to the conductor 370. The conductive via 388 and the conductive via 390 are both provided in the conductive via layer VIA0, which is above the metal layer M0 and below the metal layer M1. The route for connection is thus the second gate electrode portion 311B, the conductive contact 386 in the conductive via layer VG, the conductor 354 in the M0 metal layer, the conductive via in the conductive via layer VIA0, the conductor 370 in the M1 metal layer, the conductive via 390 in the conductive via layer VIA0, the conductor 355, and either the conductive contact 382 or the conductive contact 384 in the conductive via layer 384 to either the left or right drain/source contact 332. Accordingly, in at least one embodiment, by connecting adjacent pairs of the conductors 354, 355 in the described manner, different components are connectable without requiring a circuitous route like in other approaches. In this case, the drain/source contacts 332 adjacent to and to the left and right of the second gate electrode 311B of the second PMOS transistor is directly connected to the second gate electrodes portion 311 of the NMOS transistor. This allows for the region 300 to have a better power performance in at least some embodiments. Furthermore, in at least some embodiments, additional spacing is not required for the circuitous route as in the other approaches, thereby allowing for the region 300 to be more compact.

FIG. 3B is a schematic view of a layout diagram of another circuit region 392, in accordance with some embodiments. The circuit region 392 is the same as circuit region 300 in FIG. 3A (like element numbers are to like components) except that the circuit region 392 does not include the conductive via 388 and the conductive via 390. Instead, in this example embodiment, the circuit region 392 has an elongated conductive slot via 394 in the conductive via layer VIA0 that connects the conductor 354 and the conductor 355 to the conductor 370. In some embodiments, the elongated conductive via 394 is rectangular and has a long axis that extends in a second direction to a distance at least equal to the separation between the conductor 354 and the conductor 355. In this manner, the elongated conductive via 394 defines a long axis that connects the conductors 353, 355 to the conductor 370. In this specific embodiment, the elongated conductive via 394 has a long axis that is equal to the pitch P added to one half the width of the conductor 354 added to one half the width of the conductor 355. In this specific embodiment, the elongated conductive via 394 also define a short axis in the first direction equal to the width of the conductor 370. In this manner, the elongated conductive via 394 minimizes the contact resistance between the conductors 354, 355, 370. In some embodiments, the long axis of the elongated conductive via may be provided in any other suitable distance and the short axis may be provided in any other suitable distance.

Figure 4A:
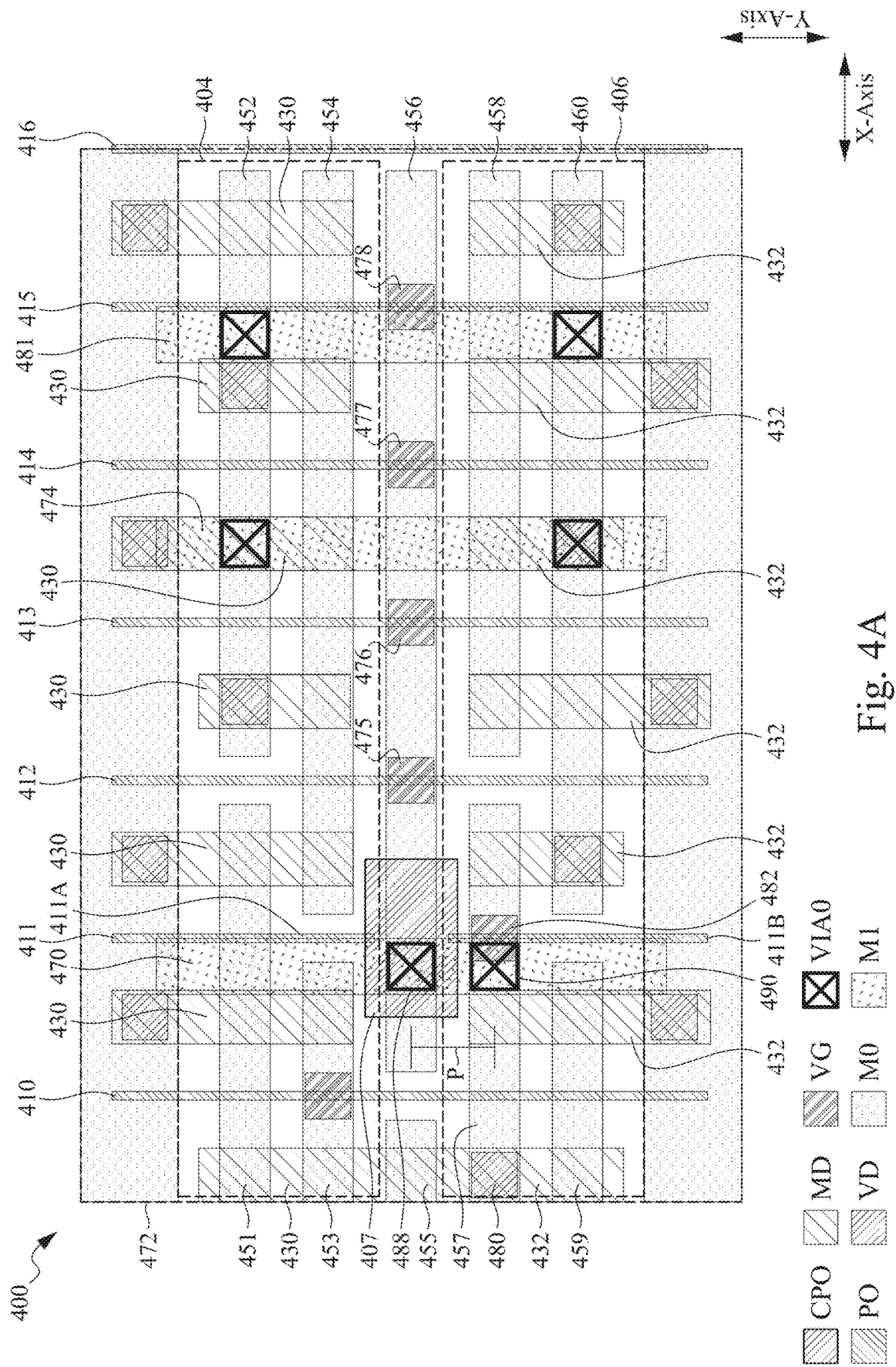
FIG. 4A is a schematic view of a layout diagram of a circuit region, in accordance with some embodiments 1.

FIG. 4A is a schematic view of a layout diagram of a circuit region 400, in accordance with some embodiments. In at least one embodiment, the circuit region 400 is an example of region 104 in FIG. 1. In the example shown in FIG. 4A, the region 400 includes a semiconductor substrate 402, a first active region 404, a second active region 406, gate electrodes 410, 411, 412, 413, 414, 415, 416, drain/source contacts 430, 432, conductors 451, 452, 453, 454, 455, 456, 457, 458, 459, 460 that are formed in a first metal layer, conductors 470, 474, 481 that are formed in a second metal layer and a boundary 472. The first active region 404 and the second active region 406 are arranged inside the boundary 472, and extend along a first direction, i.e., parallel to the X axis. Active regions 404, 406 are provided as oxide-definition (OD) regions. The first active region 404 and the second active region 406 include P-type dopants and/or N-type dopants to form one or more circuit elements or devices. In this example embodiment, the first active region 404 includes a P-type dopant and the second active region 406 includes an N-type dopant. The active regions 404, 406 are formed within the semiconductor substrate 402. Examples of circuit elements that may be formed include, but are not limited to, transistors and diodes. Note that the active regions 404, 406 are not contiguous and are separated by a displacement in the second direction. Furthermore, note that in this example embodiment, a CPO portion 407 is provided to separate the gate electrode 411 into a first gate electrode portion 411A and a second gate electrode portion 411B. In this example embodiment, the CPO portion 407 overlaps and is beneath the conductive via 488, the conductor 456, and the conductor 470.

Gate electrodes 410, 411, 412, 413, 414, 415, 416 each have a long axis that extends in a second direction (i.e., the Y-direction) that is transverse to the first direction. In at least one embodiment, the first direction is orthogonal to the second direction. In this example embodiment, there are a total of seven drain source regions 430 formed within the PMOS active region 404 and seven drain/source contacts 432 formed with the NMOS active region. The PMOS active region 404 is configured to form six PMOS transistors. A first PMOS transistor includes gate electrode 410 and a pair of drain/source contacts 430 that are directly adjacent to and on oppositely disposed sides of the gate electrode 410 relative to the first direction. Also, a second PMOS transistor includes first gate electrode portion 411A and a pair of drain/source contacts 430 that are directly adjacent to and on oppositely disposed sides of the gate electrode 411 relative to the first direction. Furthermore, a third PMOS transistor includes gate electrode 412 and a pair of drain/source contacts 430 that are directly adjacent to and on oppositely disposed sides of the gate electrode 412 relative to the first direction. Additionally, a fourth PMOS transistor includes gate electrode 413 and a pair of drain/source contacts 430 that are directly adjacent to and on oppositely disposed sides of the gate electrode 413 relative to the first direction. Also, a fifth PMOS transistor includes gate electrode 414 and a pair of drain/source contacts 430 that are directly adjacent to and on oppositely disposed sides of the gate electrode 414 relative to the first direction. Finally, a sixth PMOS transistor that includes gate electrode 415 and a pair of drain/source contacts 430 that are directly adjacent to and on oppositely disposed sides of the gate electrode 415 relative to the first direction. The NMOS active region 406 is configured to form six NMOS transistors. A first NMOS transistor includes gate electrode 410 and a pair of drain/source contacts 432 that are directly adjacent to and on oppositely disposed sides of the gate electrode 410 relative to the first direction. Also, a second NMOS transistor includes first gate electrode portion 411B and a pair of drain/source contacts 432 that are directly adjacent to and on oppositely disposed sides of the gate electrode 411 relative to the first direction. Furthermore, a third NMOS transistor includes gate electrode 412 and a pair of drain/source contacts 432 that are directly adjacent to and on oppositely disposed sides of the gate electrode 412 relative to the first direction. Additionally, a fourth NMOS transistor includes gate electrode 413 and a pair of drain/source contacts 432 that are directly adjacent to and on oppositely disposed sides of the gate electrode 413 relative to the first direction. Also, a fifth NMOS transistor includes gate electrode 414 and a pair of drain/source contacts 432 that are directly adjacent to and on oppositely disposed sides of the gate electrode 414 relative to the first direction. Finally, a sixth NMOS transistor includes gate electrode 415 and a pair of drain/source contacts 432 that are directly adjacent to and on oppositely disposed sides of the gate electrode 415 relative to the first direction. The gate electrode 416 provided right Y-extending edge of the boundary 472 of the region 400.

In this example embodiment, the PMOS active region 404 and the NMOS active region 406 are not contiguous and are separated by a section of the substrate 402. However, the first drain/source contact 430 and the first drain/source contact 432 (first looking from left to right relative to the X-axis) are contiguous and the fifth drain/source contact 430 and the fifth drain/source contact 432 (fifth looking from left to right relative to the X-axis) are contiguous. The second, third, fourth and seventh drain/source contact 430 and the second, third, fourth and seventh drain/source contact 432 (second, third, fourth and seventh looking from left to right relative to the X-axis) are not contiguous.

In this example embodiment, all of the conductors 451, 452, 453, 454, 455, 456, 457, 458, 459, 460 each define a long axis that extends in the first direction and are provided in the M0 metal layer. The conductors 451, 452, 453, 454, 455, 456, 457, 458, 459, 460 are all spaced apart from each other in the second direction by a pitch P. Furthermore, adjacent conductors 451, 452, 453, 454, 455, 456, 457, 458, 459, 460 are spaced in accordance with a pitch P (the pitch P is only shown once in FIG. 4A for the sake of clarity) relative to the second direction. Accordingly, the conductor 456 extend in the first direction and the conductor 457 extend in the first direction. Both the conductor 456 and the conductor 457 are directly adjacent to one another and are therefore spaced at the pitch P in the second direction. No other conductor in the M0 metal layer is arranged between the conductor 456 and the conductor 457 in the second direction.

The conductor 456 and the conductor 457 are connected to one another. More specifically, a second metal layer includes a conductor 470 that connects the conductor 456 and the conductor 457. In this example, the second metal layer is an M1 metal layer that is formed over the M0 metal layer. The conductor 470 defines a long axis that extends in the second direction. In this example embodiment, the conductor 470 is formed in the M1 metal layer. The conductor 470 extends over the adjacent pair of conductors 456, 457. In this example, the conductor 456 extends over the drain/source contact 430 adjacent to and to the left of the gate electrode 412 of the second PMOS transistor. A conductive contact 475 in a conductive via layer VG connects the gate electrode portion 412 of the third PMOS transistor and the third NMOS transistor to the conductor 456, a conductive contact 476 in the conductive via layer VG connects the gate electrode portion 413 of the fourth PMOS transistor and the fourth NMOS transistor to the conductor 456, a conductive contact 477 in the conductive via layer VG connects the gate electrode portion 414 of the fifth PMOS transistor and the fifth NMOS transistor to the conductor 456, and a conductive contact 478 in the conductive via layer VG connects the gate electrode portion 415 of the sixth PMOS transistor and the sixth NMOS transistor to the conductor 456. The conductive via layer VG is provided beneath the M0 layer and above the PO layer, wherein the gate electrodes 410, 411, 412, 413, 414, 415, 416 are all formed in the PO layer. A conductive contact 480 in a conductive via layer VD connects the drains/source region 432 (adjacent to and to the left of the gate electrode 410 of the first NMOS transistor) to the conductor 457, and a conductive contact 482 connects the second gate electrode portion 411B of the second NMOS transistor to the conductor 457. The conductive via layer VD is provided beneath the M0 layer and above the MD layer that forms the drain/source contacts 430, 432. The PO layer is provided below the M0 layer and above the active regions 430, 432.

In order to connect the drain/source contact 432 adjacent to and to the left of the gate electrode 410 of the first NMOS transistor and the first gate electrode portion 411B to the gate electrode 412 of the third PMOS/NMOS transistor, the gate electrode 413 of the fourth PMOS/NMOS transistor, the gate electrode 414 of the fifth PMOS/NMOS transistor and to the gate electrode 415 of the sixth PMOS/NMOS transistor, a conductive via 488 connects the conductor 456 to the conductor 470 and a conductive via 490 connects the conductor 457 to the conductor 470. The conductive via 488 and the conductive via 490 are both provided in the conductive via layer VIA0, which is above the metal layer M0 and below the metal layer M1. The route for connection is thus begins at either the drain/source contact 432 of the first NMOS transistor and goes to the conductive contact 480 in the conductive via layer VG or at the first gate electrode portion 411B and goes to the conductive contact 482 in the conductive via layer VD. The route continues to the conductive via 490 in the conductive via layer VIA0, then to the conductor 470 in the M1 metal layer, then to the conductive via 488 in the conductive via layer VIA0 and then to the conductor 456 in the M0 metal layer. Finally, the route ends through the conductive contact 475 in the conductive via layer VG to the gate electrode 412, the conductive contact 476 in the conductive via layer VG to the gate electrode 413, the conductive contact 477 in the conductive via layer VG to the gate electrode 414, or the conductive contact 478 in the conductive via layer VG to the gate electrode 415. Accordingly, in at least one embodiment, by connecting adjacent pairs of the conductors 456, 457 in the described manner, different components are connectable without requiring a circuitous route like in other approaches. Furthermore, as shown in FIG. 4A, various drains are connected to the conductor 460. This arrangement allows for the connections to the gate electrodes 411, 412, 413, 414, 415 to be separated from the connections to the drains connected to the conductor 460 without increasing the pitch P between the conductors 451, 452, 453, 454, 455, 456, 457, 458, 459, 460. As such, the parasitic capacitance of the region 400 is reduced without increasing the pitch P between the conductors 451, 452, 453, 454, 455, 456, 457, 458, 459, 460.

Figure 4B:
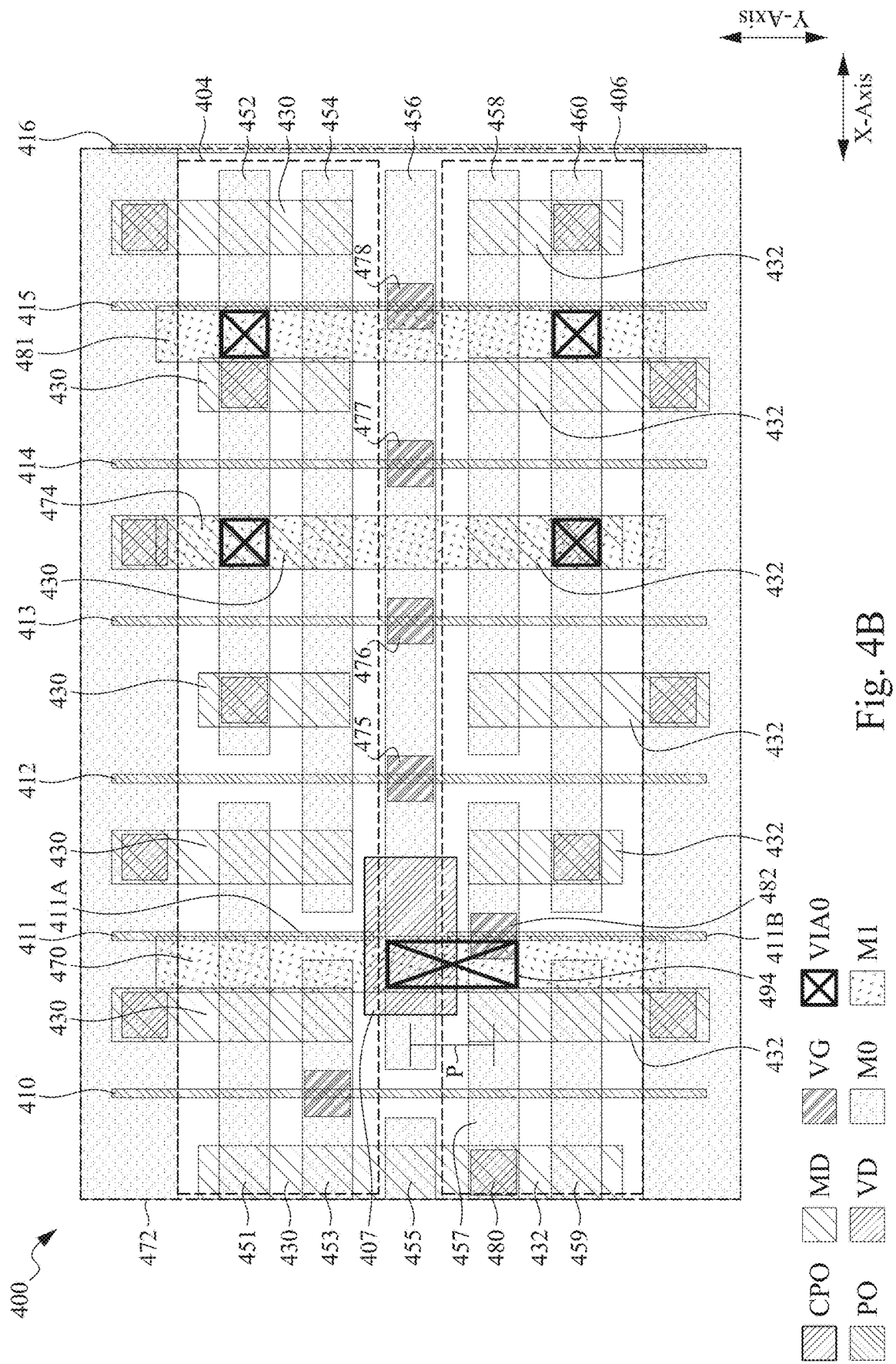
FIG. 4B is a schematic view of a layout diagram of another circuit region, in accordance with some embodiments.

FIG. 4B is a schematic view of a layout diagram of another circuit region 492, in accordance with some embodiments. The circuit region 492 is the same as circuit region 400 in FIG. 4A (like element numbers are to like components) except that the circuit region 492 does not include the conductive via 488 and the conductive via 490. Instead, in this example embodiment, the circuit region 492 has an elongated conductive slot via 494 in the conductive via layer VIA0 that connects the conductor 456 and the conductor 457 to the conductor 470. In some embodiments, the elongated conductive via 494 is rectangular and has a long axis that extends in a second direction to a distance at least equal to the separation between the conductor 456 and the conductor 457. In this manner, the elongated conductive via 494 defines a long axis that connects the conductors 456, 457 to the conductor 470. In this specific embodiment, the elongated conductive via 494 has a long axis that is equal to the pitch P added to one half the width of the conductor 456 added to one half the width of the conductor 457. In this specific embodiment, the elongated conductive via 494 also define a short axis in the first direction equal to the width of the conductor 470. In this manner the elongated conductive via 494 defines a long axis that connects the conductors 456, 457 to the conductor 470. In this specific embodiment, the elongated conductive via 494 has a long axis that is equal to the pitch P added to one half the width of the conductor 456 added to one half the width of the conductor 457. In this specific embodiment, the elongated conductive via 294 also define a short axis in the first direction equal to the width of the conductor 470. In this manner, the elongated conductive via 294 minimizes the contact resistance between the conductors 456, 457, 470. In some embodiments, the long axis of the elongated conductive via may be provided in any other suitable distance and the short axis may be provided in any other suitable distance.

Figure 5A:
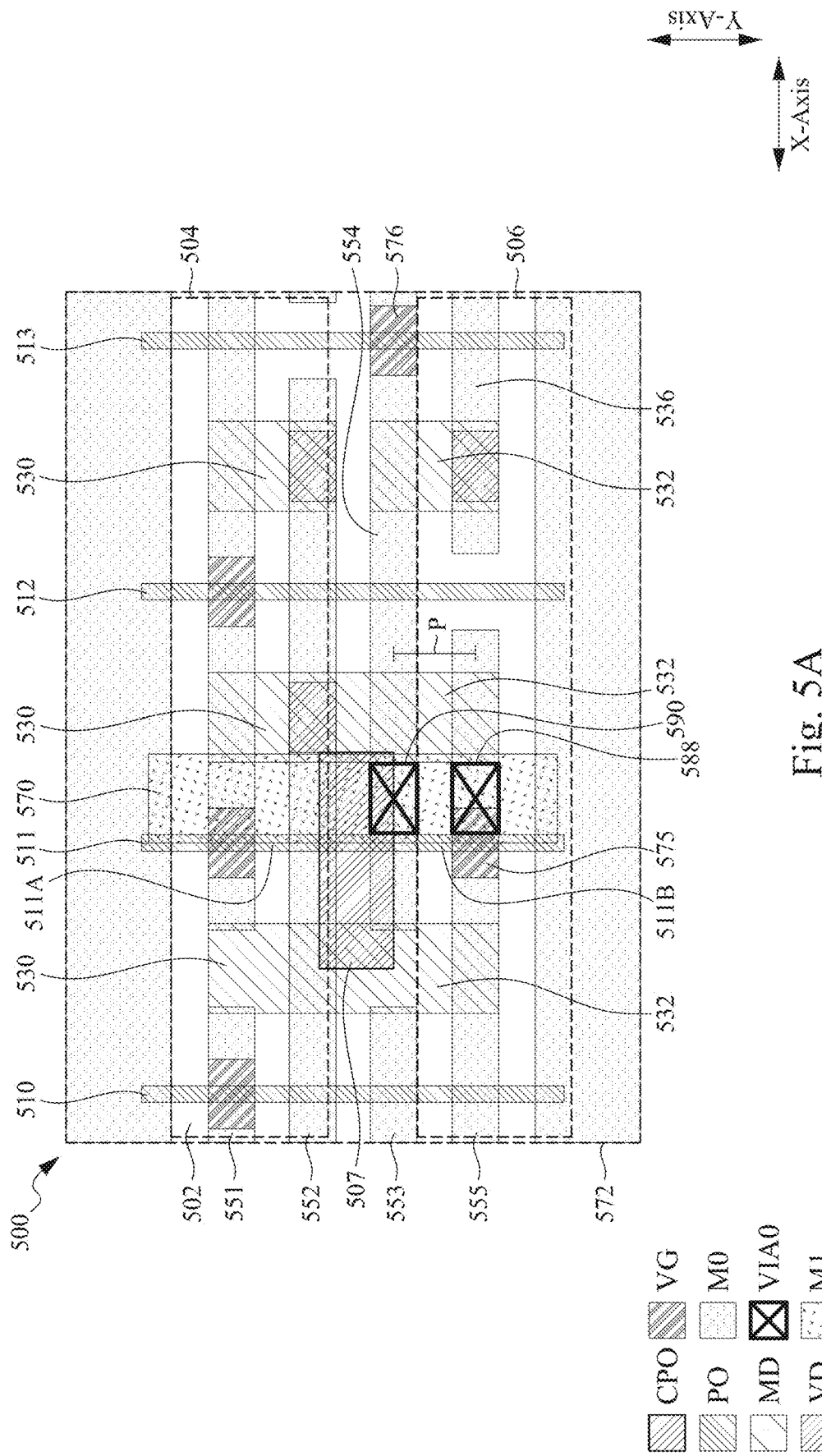
FIG. 5A is a schematic view of a layout diagram of a circuit region, in accordance with some embodiments.

FIG. 5A is a schematic view of a layout diagram of a circuit region 500, in accordance with some embodiments. In at least one embodiment, the circuit region 500 is an example of region 104 in FIG. 1. In the example shown in FIG. 5A, the region 500 includes a semiconductor substrate 502, a first active region 504, a second active region 506, gate electrodes 510, 511, 512, 513, drain/source contacts 530, 532, conductors 551, 552, 553, 554, 555, 556, that are formed in a first metal layer, a conductor 570 that is formed in a second metal layer and a boundary 572. The first active region 504 and the second active region 506 are arranged inside the boundary 572, and extend along a first direction, i.e., parallel to the X axis. Active regions 504, 506 are provided as OD regions. The first active region 504 and the second active region 506 include P-type dopants and/or N-type dopants to form one or more circuit elements or devices. In this example embodiment, the first active region 504 includes a P-type dopant and the second active region 506 includes an N-type dopant. The active regions 504, 506 are formed within the semiconductor substrate 502. Note that the active regions 504, 506 are not contiguous and are separated by a displacement in the second direction. Furthermore, note that in this example embodiment, a CPO portion 507 is provided to separate the gate electrode 511 into a first gate electrode portion 511A and a second gate electrode portion 511B. In this example embodiment, the CPO portion 507 overlaps and is beneath the conductive via 590, the conductor 551, and the conductor 554.

Gate electrodes 510, 511, 512, 513, each have a long axis that extends in a second direction (i.e., the Y-direction) that is transverse to the first direction. In at least one embodiment, the first direction is orthogonal to the second direction. In this example embodiment, there are a total of three drain/source contacts 530 formed within the PMOS active region 504 and three drain/source contacts 532 formed with the NMOS active region. The PMOS active region 504 is configured to form four PMOS transistors. A first PMOS transistor includes gate electrode 510. Additionally, a second PMOS transistor includes the first gate electrode portion 511A and a pair of drain/source contacts 530 that are directly adjacent to and on oppositely disposed sides of the first gate electrode portion 511A relative to the first direction. Also, a third PMOS transistor includes gate electrode 512 and a pair of drain/source contacts 530 that are directly adjacent to and on oppositely disposed sides of the gate electrode 512 relative to the first direction. Finally, a fourth PMOS transistor includes gate electrode 513. The NMOS active region 506 is configured to form four NMOS transistors. A first NMOS transistor includes gate electrode 510. Also, a second NMOS transistor includes the second gate electrode portion 511B and a pair of drain/source contacts 532 that are directly adjacent to and on oppositely disposed sides of the second gate electrode portion 511B relative to the first direction. Furthermore, a third NMOS transistor includes gate electrode 512 and a pair of drain/source contacts 532 that are directly adjacent to and on oppositely disposed sides of the gate electrode 512 relative to the first direction. Finally, a fourth NMOS transistor includes gate electrode 513.

In this example embodiment, the PMOS active region 504 and the NMOS active region 506 are not contiguous and are separated by a section of the substrate 502. However, the first drain/source contact 530 and the first drain/source contact 532 (first looking from left to right relative to the X-axis) are contiguous and the second drain/source contact 530 and the second drain/source contact 532 (second looking from left to right relative to the X-axis) are contiguous. The third drain/source contact 530 and the third drain/source contact 532 (third looking from left to right relative to the X-axis) are not contiguous.

In this example embodiment, all of the conductors 551, 552, 553, 554, 555, 556 each define a long axis that extends in the first direction and are provided in the M0 metal layer. The conductors 551, 552, 553, 554, 555, 556 are all spaced apart from each other in the second direction by a pitch P. Furthermore, adjacent conductors 551, 552, 553, 554, 555, 556, are spaced in accordance with a pitch P (the pitch P is only shown once in FIG. 5A for the sake of clarity) relative to the second direction. Accordingly, the conductor 554 extends in the first direction and the conductor 555 extends in the first direction. Both the conductor 554 and the conductor 555 are directly adjacent to one another and are therefore spaced at the pitch P in the second direction. No other conductor in the M0 metal layer is arranged between the conductor 554 and the conductor 555 in the second direction.

The conductor 554 and the conductor 555 are connected to one another. More specifically, a second metal layer includes a conductor 570 that connects the conductor 554 and the conductor 555. In this example, the second metal layer is an M1 metal layer that is formed over the M0 metal layer. The conductor 570 defines a long axis that extends in the second direction. In this example embodiment, the conductor 570 is formed in the M1 metal layer. The conductor 570 extends over the adjacent pair of conductors 554, 555. In this example, the conductor 555 extends over the gate electrode 511 of the second NMOS transistor. A conductive contact 575 in a conductive via layer VG connects the second gate electrode portion 511B of the second NMOS transistor to the conductor 555, and a conductive contact 576 in the conductive via layer VG connects the gate electrode 513 of the fourth NMOS transistor and the fourth NMOS transistor to the conductor 554. The conductive via layer VG is provided beneath the M0 layer and above the PO layer, wherein the gate electrodes 510, 511, 512, 513 are all formed in the PO layer. Note that the gate electrode 512 is between and is the gate electrode directly adjacent to the gate electrode 511 and the gate electrode 513. The conductive via layer VD is provided beneath the M0 layer and above the MD layer that forms the drain/source contacts 530, 532. The PO layer is provided below the M0 layer and above the active regions 530, 532.

In order to connect the gate electrode 511 of the second NMOS transistor and the gate electrode 513 of the fourth NMOS transistor, a conductive via 588 connects the conductor 555 to the conductor 570 and a conductive via 590 connects the conductor 556 to the conductor 570. The conductive via 588 and the conductive via 590 are both provided in the conductive via layer VIA0, which is above the metal layer M0 and below the metal layer M1. The route for connection is thus begins at the gate electrode 511 of the second NMOS transistor and goes to the conductive contact 575 in the conductive via layer VG. The route continues to the conductive via 588 in the conductive via layer VIA0, then to the conductor 570 in the M1 metal layer, then to the conductive via 590 in the conductive via layer VIA0 and then to the conductor 554 in the M0 metal layer. Finally, the route ends through the conductive contact 576 in the conductive via layer VG to the gate electrode 513. Accordingly, in at least one embodiment, by connecting adjacent pairs of the conductors 554, 555 in the described manner, different components are connectable without requiring a circuitous route like in other approaches. This arrangement thus saves routing resources and reduces power consumption due to the shorter path.

Figure 5B:
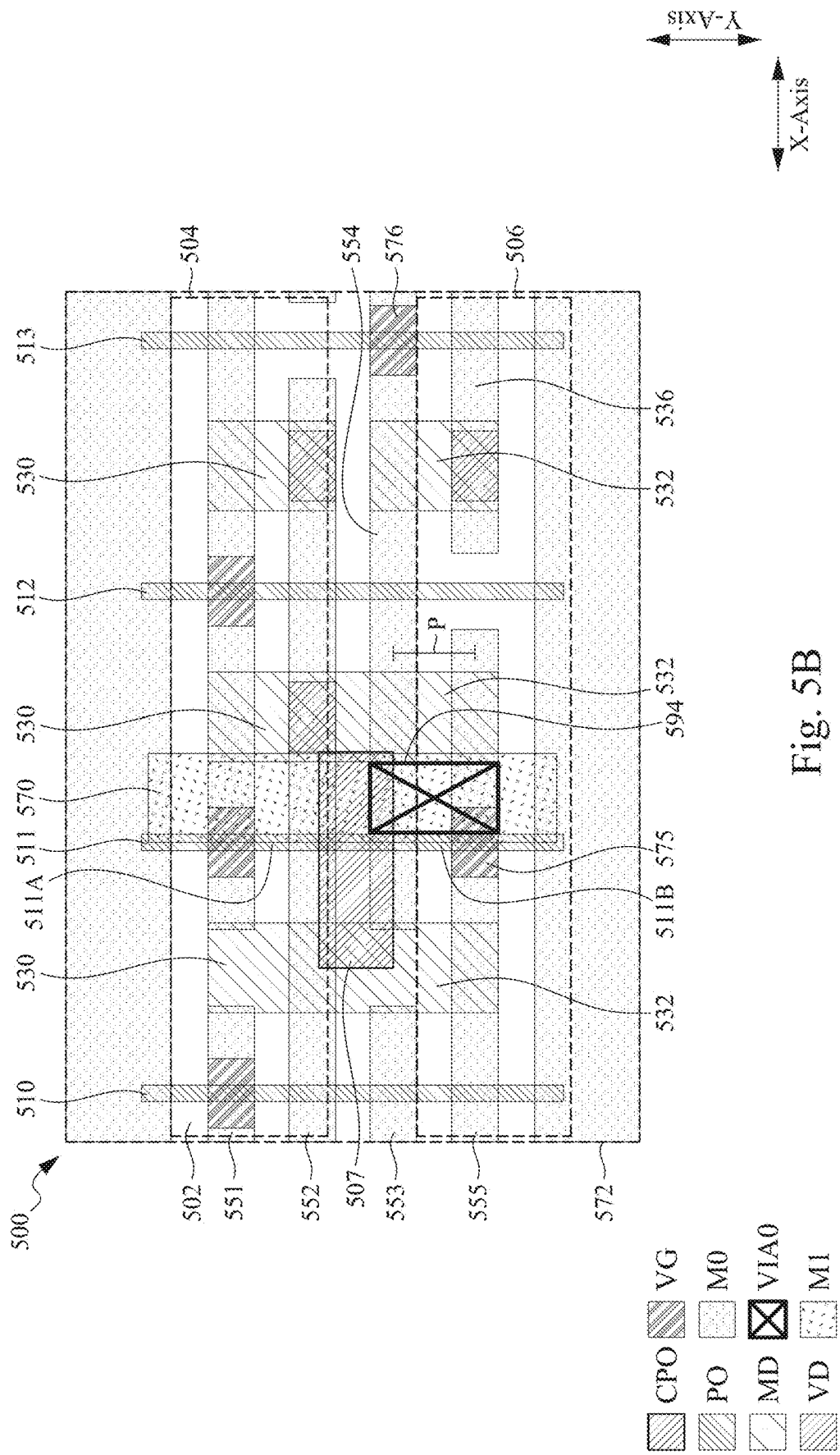
FIG. 5B is a schematic view of a layout diagram of another circuit region, in accordance with some embodiments.

FIG. 5B is a schematic view of a layout diagram of another circuit region 592, in accordance with some embodiments. The circuit region 592 is the same as circuit region 500 in FIG. 5A (like element numbers are to like components) except that the circuit region 592 does not include the conductive via 588 and the conductive via 590. Instead, in this example embodiment, the circuit region 592 has an elongated conductive slot via 594 in the conductive via layer VIA0 that connects the conductor 554 and the conductor 555 to the conductor 570. In some embodiments, the elongated conductive via 594 is rectangular and has a long axis that extends in a second direction to a distance at least equal to the separation between the conductor 554 and the conductor 555. In this manner, the elongated conductive via 594 defines a long axis that connects the conductors 554, 555 to the conductor 570. In this specific embodiment, the elongated conductive via 594 has a long axis that is equal to the pitch P added to one half the width of the conductor 554 added to one half the width of the conductor 555. In this specific embodiment, the elongated conductive via 594 also define a short axis in the first direction equal to the width of the conductor 570. In this manner the elongated conductive via 594 defines a long axis that connects the conductors 554, 555 to the conductor 570. In this specific embodiment, the elongated conductive via 594 has a long axis that is equal to the pitch P added to one half the width of the conductor 554 added to one half the width of the conductor 555. In this specific embodiment, the elongated conductive via 594 also define a short axis in the first direction equal to the width of the conductor 570. In this manner, the elongated conductive via 594 minimizes the contact resistance between the conductors 555, 556, 570. In some embodiments, the long axis of the elongated conductive via may be provided in any other suitable distance and the short axis may be provided in any other suitable distance.

Figure 6A:
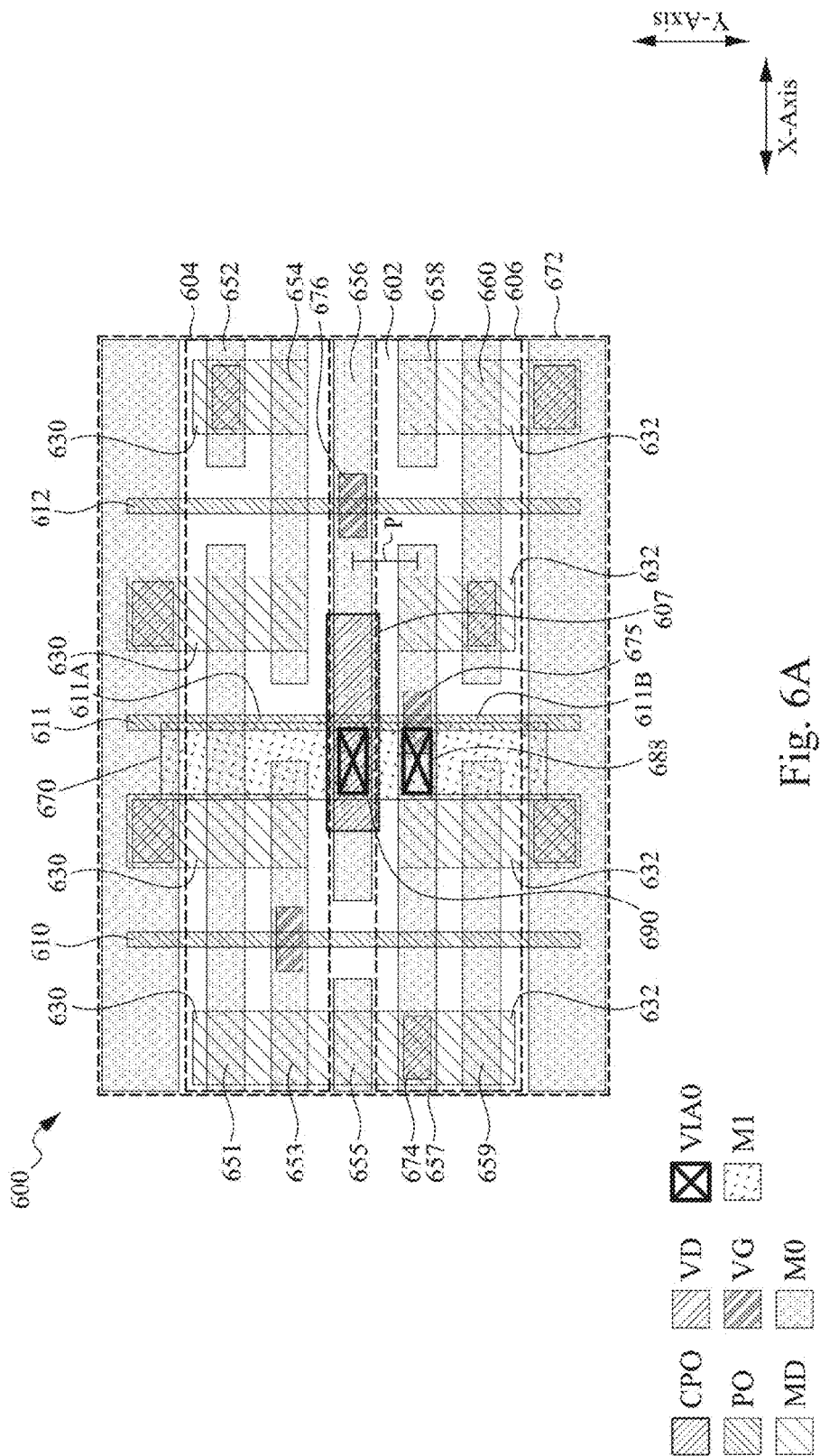
FIG. 6A is a schematic view of a layout diagram of a circuit region, in accordance with some embodiments.

FIG. 6A is a schematic view of a layout diagram of a circuit region 600, in accordance with some embodiments. In at least one embodiment, the circuit region 600 is an example of region 104 in FIG. 1. In the example shown in FIG. 6A, the region 600 includes a semiconductor substrate 602, a first active region 604, a second active region 606, gate electrodes 610, 611, 612, drain/source contacts 630, 632, conductors 651, 652, 653, 654, 655, 656, 657, 658, 659, 660 that are formed in a first metal layer, a conductor 670 that is formed in a second metal layer and a boundary 672. The first active region 604 and the second active region 606 are arranged inside the boundary 672, and extend along a first direction, i.e., parallel to the X axis. Active regions 604, 606 are provided as OD regions. The first active region 604 and the second active region 606 include P-type dopants and/or N-type dopants to form one or more circuit elements or devices. In this example embodiment, the first active region 604 includes a P-type dopant and the second active region 606 includes an N-type dopant. The active regions 604, 606 are formed within the semiconductor substrate 602. Note that the active regions 604, 606 are not contiguous and are separated by a displacement in the second direction. Furthermore, note that in this example embodiment, a CPO portion 607 is provided to help provide isolation. In this example embodiment, the CPO portion 607 splits the gate electrode 611 into a first gate electrode portion 611A and a second gate electrode portion 611B. Furthermore, the CPO portion 407 overlaps and is beneath the conductive via 690 and the conductor 656.

Gate electrodes 610, 611, 612, 613, each have a long axis that extends in a second direction (i.e., the Y-direction) that is transverse to the first direction. In at least one embodiment, the first direction is orthogonal to the second direction. In this example embodiment, four drain/source contacts 630 are formed within the PMOS active region 604 and four drain/source contacts 632 are formed with the NMOS active region. The PMOS active region 604 is configured to form three PMOS transistors. A first PMOS transistor that includes gate electrode 610 and a pair of drain/source contacts 630 that are directly adjacent to and on oppositely disposed sides of the gate electrode 611 relative to the first direction. Also, a second PMOS transistor includes the first gate electrode portion 611B and a pair of drain/source contacts 630 that are directly adjacent to and on oppositely disposed sides of the first gate electrode portion 611B relative to the first direction. Finally, a third PMOS transistor includes gate electrode 612 and a pair of drain/source contacts 630 that are directly adjacent to and on oppositely disposed sides of the gate electrode 612 relative to the first direction. The NMOS active region 606 is configured to form three NMOS transistors. A first NMOS transistor includes gate electrode 610 and a pair of drain/source contacts 632 that are directly adjacent to and on oppositely disposed sides of the gate electrode 610 relative to the first direction. Also, a second NMOS transistor includes the second gate electrode portion 611B and a pair of drain/source contacts 632 that are directly adjacent to and on oppositely disposed sides of the second gate electrode portion 611B relative to the first direction. Finally, a third NMOS transistor includes gate electrode 612 and a pair of drain/source contacts 632 that are directly adjacent to and on oppositely disposed sides of the gate electrode 612 relative to the first direction.

In this example embodiment, the PMOS active region 604 and the NMOS active region 606 are not contiguous and are separated by a section of the substrate 602. However, the first drain/source contact 630 is contiguous. The second drain/source contact 630 and the second drain/source contact 632, the third drain/source contact 630 and the third drain/source contact 632 (third looking from left to right relative to the X-axis), and the fourth drain/source contact 630 and the fourth drain/source contact 632 (fourth looking from left to right relative to the X-axis) are not contiguous.

In this example embodiment, all of the conductors 651, 652, 653, 654, 655, 656, 657, 658, 659, 660 each define a long axis that extends in the first direction and are provided in the M0 metal layer. The conductors 651, 652, 653, 654, 655, 656, 657, 658, 659, 660 are all spaced apart from each other in the second direction by a pitch P. Furthermore, adjacent conductors 651, 652, 653, 654, 655, 656, 657, 658, 659, 660 are spaced in accordance with a pitch P (the pitch P is only shown once in FIG. 6A for the sake of clarity) relative to the second direction. Accordingly, the conductor 656 extend in the first direction and the conductor 657 extend in the first direction. Both the conductor 656 and the conductor 657 are directly adjacent to one another and are therefore spaced at the pitch P in the second direction. No other conductor in the M0 metal layer is arranged between the conductor 656 and the conductor 657 in the second direction.

The conductor 657 and the conductor 656 are connected to one another. More specifically, a second metal layer includes a conductor 670 that connects the conductor 657 and the conductor 656. In this example, the second metal layer is an M1 metal layer that is formed over the M0 metal layer. The conductor 670 defines a long axis that extends in the second direction. In this example embodiment, the conductor 670 is formed in the M1 metal layer. The conductor 670 extends over the adjacent pair of conductors 656, 657. In this example, the conductor 657 extends over the second gate electrode portion 611B of the second NMOS transistor and the drain/source contact 632 to the left and directly adjacent to the gate electrode 610. A conductive contact 674 in the conductive via layer VD connects the drain/source contact 632 to the left and directly adjacent to the gate electrode 610 to the conductor 655, a conductive contact 675 in a conductive via layer VG connects the second gate electrode portion 611B of the second NMOS transistor to the conductor 657, and a conductive contact 676 in the conductive via layer VG connects the gate electrode 612 to the conductor 656. The conductive via layer VG is provided beneath the M0 layer and above the PO layer, wherein the gate electrodes 610, 611, 612 are all formed in the PO layer. Note that the gate electrode 611 is between and is the gate electrode directly adjacent to the gate electrode 610 and the gate electrode 612. The conductive via layer VD is provided beneath the M0 layer and above the MD layer that forms the drain/source contacts 630, 632. The PO layer is provided below the M0 layer and above the active regions 630, 632.

In order to connect the second gate electrode portion 611B of the second NMOS transistor, the drain/source contact 674 to the left and directly adjacent to the gate electrode 610, and the gate electrode 612, a conductive via 688 connects the conductor 657 to the conductor 670 and a conductive via 690 connects the conductor 656 to the conductor 670. The conductive via 688 and the conductive via 690 are both provided in the conductive via layer VIA0, which is above the metal layer M0 and below the metal layer M1. The route for connection is thus begins at either the drain/source contact 632 directly to the left and adjacent to the gate electrode 610 and goes to the conductive contact 674 or at the second gate electrode portion 611B of the first NMOS transistor and goes to the conductive contact 675 in the conductive via layer VG. The route continues to the conductive via 688 in the conductive via layer VIA0, then to the conductor 670 in the M1 metal layer, then to the conductive via 690 in the conductive via layer VIA0 and then to the conductor 656 in the M0 metal layer. Finally, the route ends through the conductive contact 676 in the conductive via layer VG to the gate electrode 612 gate electrode 612. Accordingly, in at least one embodiment, by connecting adjacent pairs of the conductors 657, 660 in the described manner, different components are connectable without requiring a circuitous route like in other approaches. This arrangement thus saves routing resources and reduces power consumption due to the shorter path.

Figure 6B:
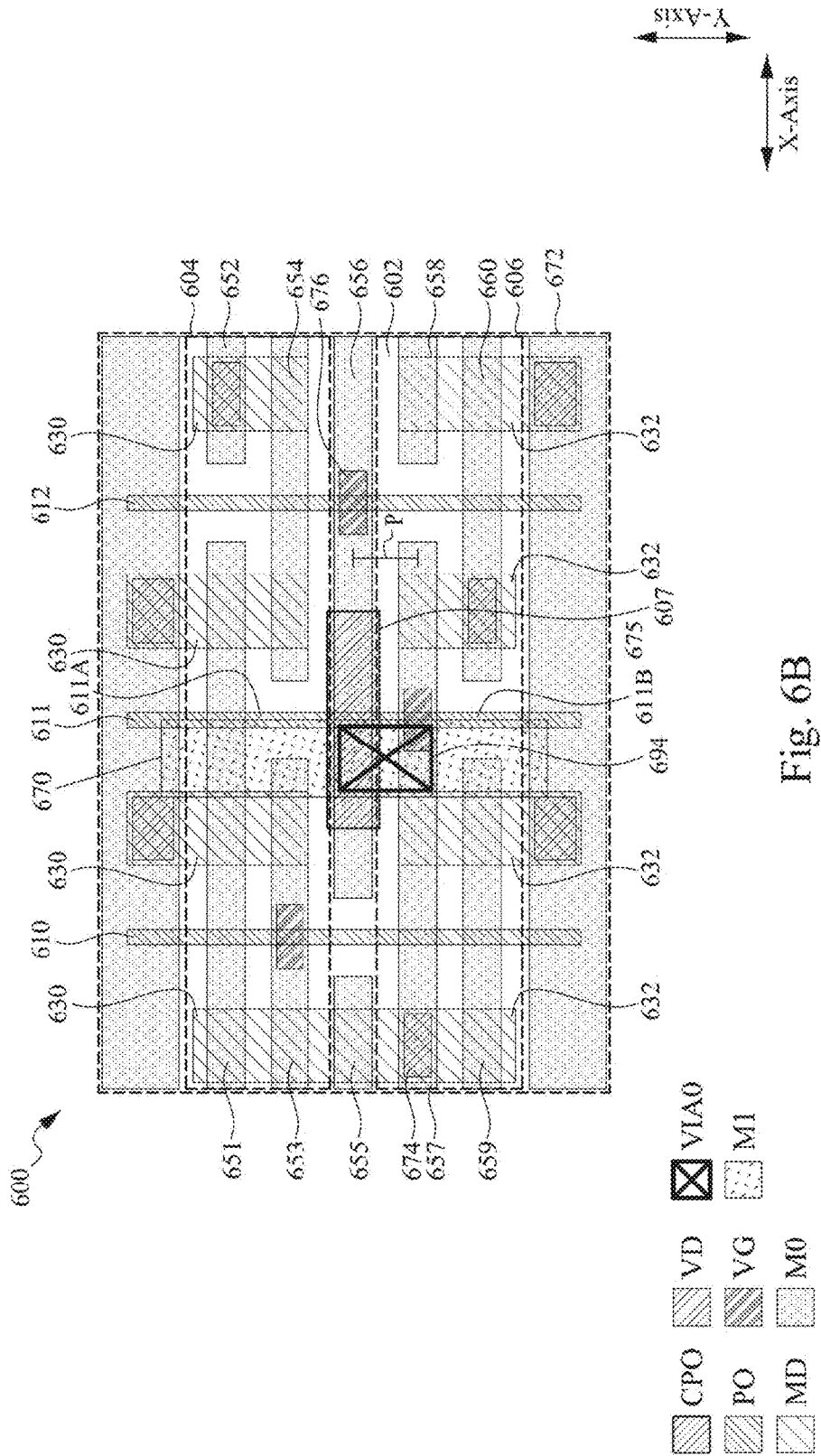
FIG. 6B is a schematic view of a layout diagram of another circuit region, in accordance with some embodiments.

FIG. 6B is a schematic view of a layout diagram of another circuit region 692, in accordance with some embodiments. The circuit region 692 is the same as circuit region 600 in FIG. 6A (like element numbers are to like components) except that the circuit region 692 does not include the conductive via 688 and the conductive via 690. Instead, in this example embodiment, the circuit region 692 has an elongated conductive slot via 694 in the conductive via layer VIA0 that connects the conductor 657 and the conductor 660 to the conductor 670. In some embodiments, the elongated conductive via 694 is rectangular and has a long axis that extends in a second direction to a distance at least equal to the separation between the conductor 657 and the conductor 660. In this manner, the elongated conductive via 694 defines a long axis that connects the conductors 657, 660 to the conductor 670. In this specific embodiment, the elon-gated conductive via 694 has a long axis that is equal to the pitch P added to one half the width of the conductor 657 added to one half the width of the conductor 660. In this specific embodiment, the elongated conductive via 694 also define a short axis in the first direction equal to the width of the conductor 670. In this manner the elongated conductive via 694 defines a long axis that connects the conductors 657, 660 to the conductor 670. In this specific embodiment, the elongated conductive via 694 has a long axis that is equal to the pitch P added to one half the width of the conductor 657 added to one half the width of the conductor 660. In this specific embodiment, the elongated conductive via 694 also define a short axis in the first direction equal to the width of the conductor 670. In this manner, the elongated conductive via 694 minimizes the contact resistance between the conductors 657, 660, 670. In some embodiments, the long axis of the elongated conductive via may be provided in any other suitable distance and the short axis may be provided in any other suitable distance.

Figure 7:
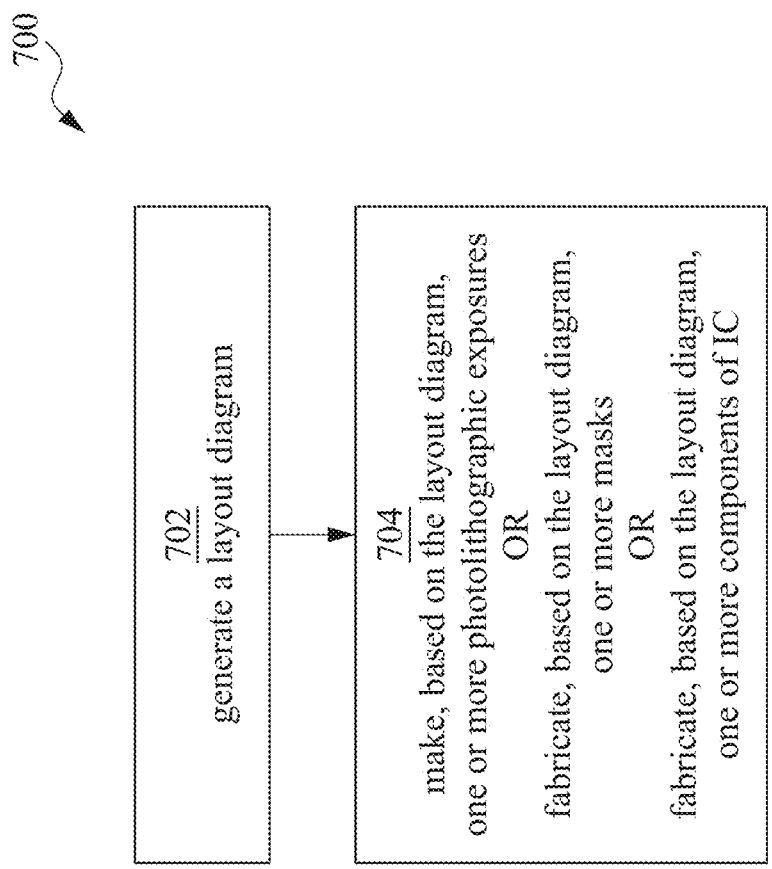
FIG. 7 is a flowchart of a method of manufacturing a semiconductor device, in accordance with some embodiments.

FIG. 7 is a flowchart of a method 700 of generating a layout diagram, in accordance with some embodiments.

Method 700 is implementable, for example, using EDA system 700 (FIG. 9, discussed below) and an integrated circuit (IC) manufacturing system 800 (FIG. 10, discussed below), in accordance with some embodiments. Regarding method 700, examples of the layout diagram include the layout diagrams disclosed herein, or the like. Examples of a semiconductor device which can be manufactured according to method 700 include semiconductor device 100 in FIG. 1.

In FIG. 7, method 700 includes blocks 702-704. At block 702, a layout diagram is generated which, among other things, include patterns represent one or more circuit regions as disclosed above in FIGS. 1-6B, or the like. An example of a semiconductor device corresponding to a layout diagram generated by block 702 includes semiconductor device 100 of FIG. 1. Block 702 is discussed in more detail below with respect to FIG. 8. From block 702, flow proceeds to block 704.

At block 704, based on the layout diagram, at least one of (A) one or more photolithographic exposures are made or (B) one or more semiconductor masks are fabricated or (C) one or more components in a layer of a semiconductor device are fabricated. See discussion below of FIG. 9.

FIG. 8A is a flowchart of a method 800 of generating a layout diagram, in accordance with some embodiments.

More particularly, the flowchart of FIG. 8A shows additional blocks that demonstrates one example of procedures that may be implemented in block 702 of FIG. 7, in accordance with one or more embodiments.

In FIG. 8A, block 702 includes blocks 802-806. At block 802, an M0 layer is generated in the layout diagram that includes a first conductor region that extends in a first direction and a second conductor region that extends in the first direction, wherein the second conductor is directly adjacent to the first conductor. In some embodiments, the first conductor region and second conductor region correspond to regions in a layout diagram that represent conductor 253 and conductor 255 in FIGS. 2A, 2B, conductor 355 and conductor 356 in FIGS. 3A, 3B, conductor 456 and conductor 457 in FIGS. 4A, 4B, conductor 554 and conductor 555 in FIGS. 5A, 5B, conductor 656 and conductor 657 in FIGS. 6A, 6B.

At block 804, an M1 layer is generated that includes a third conductor region that extends in a second direction, wherein the second direction is transverse to the first direction. In some embodiments, the third conductor region corresponds to regions in a layout diagram that represent conductor 270 in FIGS. 2A, 2B, conductor 370 in FIGS. 3A, 3B, conductor 470 in FIGS. 4A, 4B, conductor 570 in FIGS. 5A, 5B, conductor 670 in FIGS. 6A, 6B.

At block 806, a VIA0 layer is generated that includes a first conductive via region that connects the first conductor region to the third conductor region and a second conductive via region that connects the second conductor region to the third conductor region. In some embodiments, the first conductive via region and second conductive via region correspond to regions in a layout diagram that represent conductive via 288 and conductive via 290 in FIG. 2A, conductive via 388 and conductive via 390 in FIG. 3A, conductive via 488 and conductive via 490 in FIG. 4A, conductive via 588 and conductive via 590 in FIG. 5A, conductive via 688 and conductive via 690 in FIG. 6A.

FIG. 8B is a flowchart of a method 808 of based on the layout diagram, fabricating one or more components of a semiconductor device, in accordance with some embodiments.

More particularly, the flowchart of FIG. 8B shows additional blocks that demonstrates one example of procedures that may be implemented in block 704 of FIG. 7, in accordance with one or more embodiments.

In FIG. 8B, block 704 includes blocks 810, 812, 814. At block 810, a first metal layer is deposited and patterned to obtain a plurality of conductors extending in a first direction, wherein the plurality of conductors are spaced at a pitch in a second direction, and wherein the plurality of conductors comprises a first conductor and a second conductor which are spaced from each other at the pitch in the second direction. In some embodiments, the first conductor and second conductor correspond the conductor 253 and conductor 255 in FIGS. 2A, 2B, conductor 355 and conductor 356 in FIGS. 3A, 3B, conductor 456 and conductor 457 in FIGS. 4A, 4B, conductor 554 and conductor 555 in FIGS. 5A, 5B, conductor 656 and conductor 657 in FIGS. 6A, 6B.

An example manufacturing process starts from a substrate, such as the substrate 202 described with respect to FIGS. 2C-2E. The substrate comprises, in at least one embodiment, silicon, silicon germanium (SiGe), gallium arsenic, or other suitable semiconductor materials. Active regions are formed in or over the substrate, using one or more masks corresponding to one or more active regions in the layout diagrams described herein. A gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers, such as the gate dielectric layers 207, 209, and the gate electrode layer is patterned into one or more gate electrodes, such as the gate electrode 212 described with respect to FIG. 2C. In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/source regions, such as the drain/source regions 203, 205 described with respect to FIG. 2C, are formed in the active regions of the substrate. In at least one embodiment, the drain/source regions are formed by using the gate electrodes and the spacers as a mask. For example, the formation of the drain/source regions is performed by an ion implantation or a diffusion process. Depending on the type of the devices or transistors, the drain/source regions are doped with p-type dopants, such as boron or $BF_2$, n-type dopants, such as phosphorus or arsenic, and/or combinations thereof. A conductive layer, e.g., a metal, is deposited over the substrate, thereby making electrical connections to the drain/source regions. A planarizing process is performed to planarize the conductive layer, resulting in drain/source contacts, such as the drain/source contacts 233, 235 described with respect to FIG. 2C, in electrical contact with the underlying drain/source regions. The planarizing process comprises, for example, a chemical mechanical polish (CMP) process. A dielectric layer is deposited over the substrate with the drain/source contacts formed thereon. The dielectric layer is etched, and the etched portions are filled with a conductive material, such as a metal, to obtain one or more conductive contacts, such as the conductive contact 282 described with respect to FIG. 2C. A planarizing process is performed. An M0 layer including a conductive material, such as a metal, is deposited over the planarized structure and patterned to obtain various conductors, such as the conductors 253, 255 described with respect to FIGS. 2C-2D.

At block 812, deposition and etching are performed to obtain at least one conductive via which is over and in electrical contact with the first conductor and the second conductor. In some embodiments, the at least one conductive via corresponds to conductive via 288 and conductive via 290 in FIG. 2A and conductive via 294 in FIG. 2B, conductive via 388 and conductive via 390 in FIG. 3A and conductive via 394 in FIG. 3B, conductive via 488 and conductive via 490 in FIG. 4A and conductive via 494 in FIG. 4B, conductive via 588 and conductive via 590 in FIG. 5A and conductive via 594 in FIG. 5B, conductive via 688 and conductive via 690 in FIG. 6A and conductive via 694 in FIG. 6B.

In an example process, a dielectric layer is deposited over the patterned M0 layer. The dielectric layer is etched, and the etched portions are filled with a conductive material, such as a metal, to obtain one or more conductive vias in a V0 layer. For example, the V0 layer comprises the conductive vias 288, 290 described with respect to FIGS. 2C-2D, or the elongated conductive via 294 described with respect to FIG. 2E. A planarizing process is then performed.

At block 814, a second metal layer is deposited and patterned to obtain a third conductor that extends in the second direction, wherein the second direction is transverse to the first direction. The third conductor is over and in electrical contact with the at least one conductive via to electrically connect the first conductor and the second conductor. In some embodiments, the third conductor region corresponds to conductor 270 in FIGS. 2A, 2B, conductor 370 in FIGS. 3A, 3B, conductor 470 in FIGS. 4A, 4B, conductor 570 in FIGS. 5A, 5B, conductor 670 in FIGS. 6A, 6B.

In an example process, an M1 layer including a conductive material, such as a metal, is deposited over the planarized structure obtained at the end of the formation of one or more conductive vias in the V0 layer. The M1 layer is patterned to obtain various conductors, such as the conductor 270 described with respect to FIGS. 2C-2E. The conductor 270 electrically connects the conductors 253, 255 through the conductive vias 288, 290 as described with respect to FIG. 2D, or through the elongated conductive via 294 as described with respect to FIG. 2E.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EAD system is usable as part of a design house of an IC manufacturing system discussed below.

Figure 9:
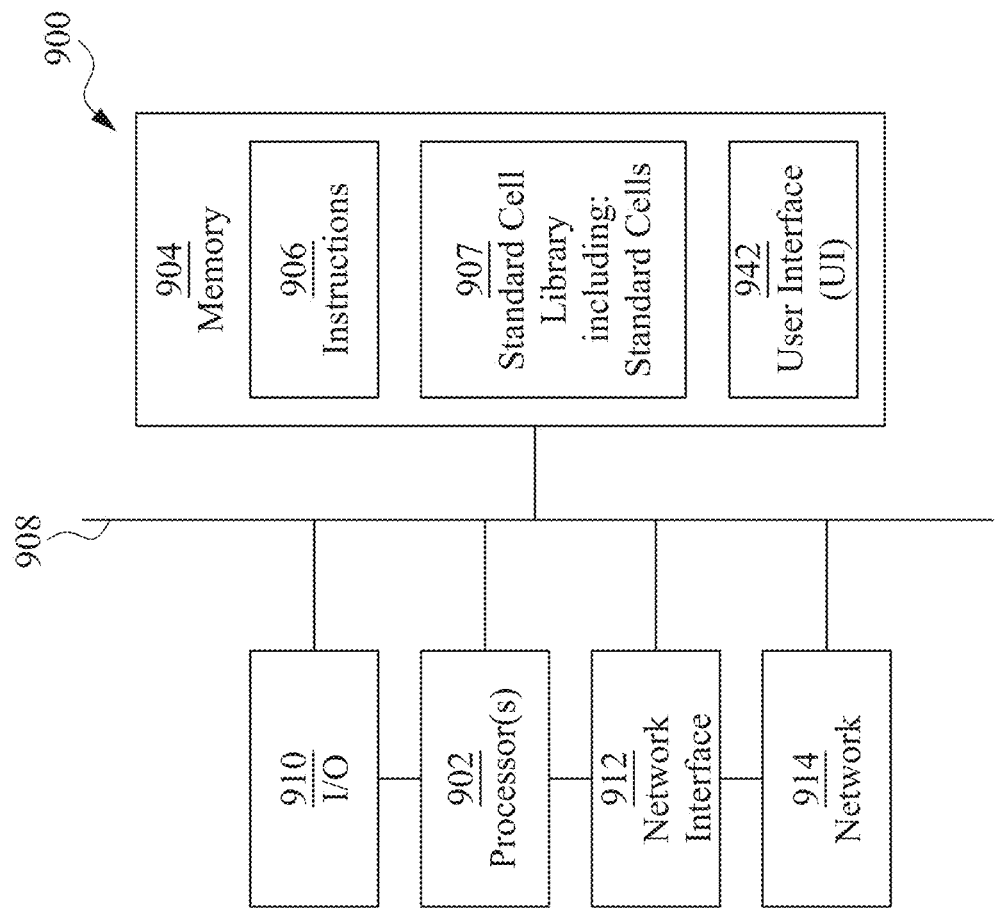
FIG. 9 is a block diagram of an electronic design automation (EDA) system in accordance with some embodiments.

FIG. 9 is a block diagram of an electronic design automation (EDA) EDA system 900 in accordance with some embodiments. The EDA system 900 is configured to generate a layout diagram as described above with respect to FIG. 8A.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including at least one hardware processor 902 and a non-transitory, computer-readable storage medium 904. Storage medium 904, amongst other things, is encoded with, i.e., stores, computer program code 906, i.e., a set of computer-executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause EDA system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows EDA system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

EDA system 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
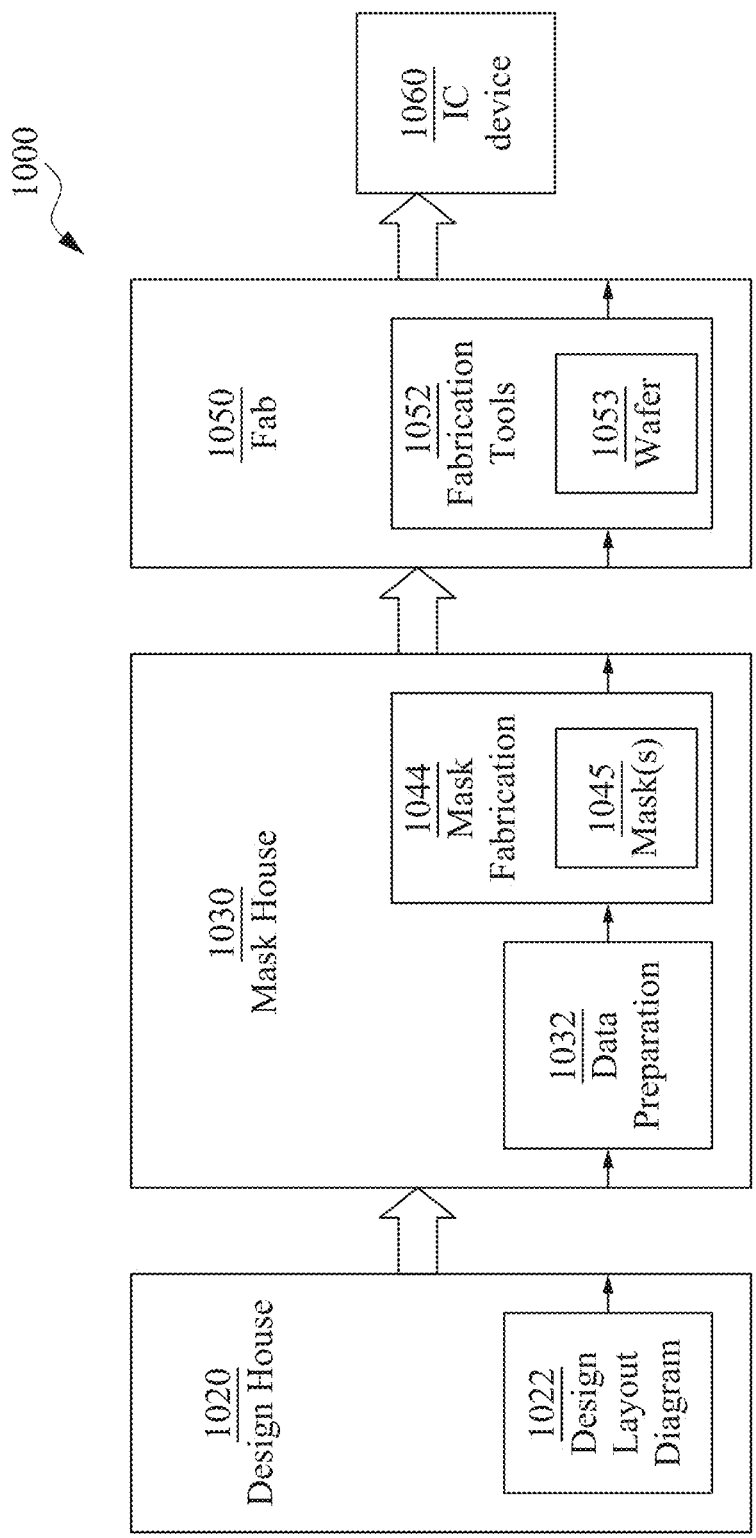
FIG. 10 is a block diagram of a semiconductor device manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. The manufacturing system 1000 is configured to manufacture the semiconductor device 100 (See FIG. 1) described above.

In some embodiments, based on a layout diagram, e.g., at least one of (A) one or more semiconductor masks or (b) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In an embodiment, a semiconductor device comprises a first metal layer, a second metal layer, a drain/source contact and at least one conductive via. The first metal layer comprises a first conductor that extends in a first direction and a second conductor that extends in the first direction, wherein the second conductor is directly adjacent to the first conductor. The second metal layer comprises a third conductor that extends in a second direction, wherein the second direction is transverse to the first direction. The drain/source contact extends in the second direction and is connected to the second conductor. The at least one conductive via connects the first conductor and the second conductor through the third conductor.

In an embodiment, a method of manufacturing a semiconductor device comprises depositing and patterning at least one of a gate electrode or a drain/source contact over a substrate. The method further comprises depositing and patterning a first metal layer to obtain a plurality of conductors extending in a first direction. The plurality of conductors are spaced at a pitch in a second direction, and the plurality of conductors comprises a first conductor and a second conductor which are spaced from each other at the pitch in the second direction. The at least one of the gate electrode or the drain/source contact extends in the second direction and overlaps, in a thickness direction of the substrate, at least one of the first conductor or the second conductor. The method further comprises etching and depositing at least one conductive via over and in electrical contact with the first conductor and the second conductor. The method further comprises depositing and patterning a second metal layer to obtain a third conductor that extends in the second direction. The second direction is transverse to the first direction. The third conductor is over and in electrical contact with the at least one conductive via to electrically connect the first conductor and the second conductor.

In an embodiment, a non-transitory computer readable recording medium comprises a layout diagram of a semiconductor device. The layout diagram comprises, in an M0 layer, a first conductor region that extends in a first direction and a second conductor region that extends in the first direction, wherein the second conductor region is directly adjacent to the first conductor region. The layout diagram further comprises, in an M1 layer, a third conductor region that extends in a second direction, wherein the second direction is transverse to the first direction. The layout diagram further comprises a drain/source contact that extends in the second direction and overlaps the third conductor region. The layout diagram further comprises, in a VIA0 layer, at least one conductive via that connects the third conductor region to the first conductor region and the second conductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first metal layer comprising:
      a first conductor that extends in a first direction;
      a second conductor that extends in the first direction, wherein the second conductor is directly adjacent to the first conductor;
   a second metal layer comprising a third conductor that extends in a second direction, wherein the second direction is transverse to the first direction;
   a drain/source contact that extends in the second direction and is connected to the second conductor; and
   at least one conductive via that connects the first conductor and the second conductor through the third conductor.

2. The semiconductor device of claim 1, wherein the second metal layer is over the first metal layer.

3. The semiconductor device of claim 1, wherein
   the first metal layer is an M0 layer which is a metal layer closest to the drain/source contact,
   the second metal layer is an M1 layer which is a metal layer directly adjacent to the M0 layer, and
   the at least one conductive via is in a via layer between the M0 layer and the M1 layer.

4. The semiconductor device of claim 1, wherein the at least one conductive via comprises:
   a first conductive via that connects the third conductor to the first conductor; and
   a second conductive via that connects the third conductor to the second conductor.

5. The semiconductor device of claim 1, wherein the at least one conductive via comprises a conductive slot via that is elongated in the second direction and connects the third conductor to both the first conductor and the second conductor.

6. The semiconductor device of claim 1, wherein
   the first metal layer comprises a plurality of conductors extending in the first direction and spaced from each other at a pitch in the second direction, and
   the plurality of conductors comprises the first conductor and the second conductor which are spaced from each other at the pitch in the second direction.

7. The semiconductor device of claim 1, wherein
   the first metal layer comprises a plurality of conductors extending in the first direction and spaced from each other in the second direction, and
   no other conductor among the plurality of conductors in the first metal layer is arranged between the first conductor and the second conductor in the second direction.

8. The semiconductor device of claim 1, further comprising:
   a first transistor comprising a first gate electrode that extends in the second direction;
   a second transistor comprising a second gate electrode that extends in the second direction; and
   a third transistor comprising:
      a third gate electrode that extends in the second direction, and
      a drain/source region under and connected to the drain/source contact;
   wherein the first conductor is connected to the first gate electrode and the second gate electrode, and the second conductor is connected to the drain/source region through the drain/source contact.

9. The semiconductor device of claim 1, further comprising:
   a first transistor comprising a first gate electrode that extends in the second direction; and
   a second transistor comprising:
      a second gate electrode that extends in the second direction, and
      a drain/source region directly adjacent to the second gate electrode in the first direction, the drain/source region under and connected to the drain/source contact;
   wherein the first conductor is connected to the first gate electrode, and the second conductor is connected to the drain/source region through the drain/source contact.

10. The semiconductor device of claim 1, further comprising:
    a first transistor comprising:
       a first gate electrode, wherein the first gate electrode extends in the second direction;
       a first drain/source region directly adjacent to a first side of the first gate electrode, the first drain/source region under and connected to the drain/source contact; and
       a second drain/source region directly adjacent to a second side of the first gate electrode, the second drain/source region under and connected to a further drain/source contact, wherein the first side is oppositely disposed from the second side relative to the first gate electrode;
    wherein the first conductor is connected to the first gate electrode, and the second conductor is connected to the first drain/source region and the second drain/source region correspondingly through the drain/source contact and the further drain/source contact.

11. The semiconductor device of claim 10, further comprising:
    a third drain/source region aligned with but separated from the first drain/source region in the second direction, wherein the third drain/source region is of an opposite doping type than the first drain/source region; and
    a fourth drain/source region aligned with but separated from the second drain/source region in the second direction, wherein the fourth drain/source region is of an opposite doping type than the second drain/source region.

12. The semiconductor device of claim 1, further comprising:
    a first transistor comprising a first gate electrode that extends in the second direction;
    a second transistor comprising a second gate electrode that extends in the second direction; and
    a third transistor comprising a third gate electrode that extends in the second direction;
    wherein the second gate electrode is between and directly adjacent to the first gate electrode and the third gate electrode in the first direction; and
    wherein the second conductor is connected to the first gate electrode, and the first conductor is connected to the second gate electrode and the third gate electrode.

13. The semiconductor device of claim 12, wherein
    the first metal layer further comprises a fourth conductor that extends in the first direction;
    the first transistor further comprises a first drain/source region directly adjacent to the first gate electrode in the first direction;
    the third transistor further comprises a second drain/source region directly adjacent to the third gate electrode in the first direction; and the fourth conductor is connected to the first drain/source region and the second drain/source region.

14. The semiconductor device of claim 1, further comprising:
a first transistor comprising a first gate electrode that extends in the second direction, and a drain/source region that is directly adjacent to the first gate electrode, the drain/source region under and connected to the drain/source contact;
a second transistor comprising a second gate electrode that extends in the second direction; and
a third transistor comprising a third gate electrode that extends in the second direction;
wherein the second gate electrode is between the first gate electrode and the third gate electrode;
wherein the second conductor is connected to the drain/source region through the drain/source contact, and to the second gate electrode; and
wherein the first conductor is connected to the third gate electrode.

15. A method of manufacturing a semiconductor device, comprising:
depositing and patterning at least one of a gate electrode or a drain/source contact over a substrate;
depositing and patterning a first metal layer to obtain a plurality of conductors extending in a first direction, wherein
the plurality of conductors are spaced at a pitch in a second direction,
the plurality of conductors comprises a first conductor and a second conductor which are spaced from each other at the pitch in the second direction, and
the at least one of the gate electrode or the drain/source contact extends in the second direction and overlaps, in a thickness direction of the substrate, at least one of the first conductor or the second conductor;
etching and depositing at least one conductive via over and in electrical contact with the first conductor and the second conductor; and
depositing and patterning a second metal layer to obtain a third conductor that extends in the second direction, wherein
the second direction is transverse to the first direction, and
the third conductor is over and in electrical contact with the at least one conductive via to electrically connect the first conductor and the second conductor.

16. The method of claim 15, wherein
the first direction and the second direction are orthogonal to each other.

17. The method of claim 15, wherein
the at least one conductive via comprises a conductive slot via that is elongated in the second direction and connects the third conductor to both the first conductor and the second conductor.

18. A non-transitory computer readable recording medium, comprising a layout diagram of a semiconductor device, the layout diagram comprising:
in an M0 layer,
a first conductor region that extends in a first direction; and
a second conductor region that extends in the first direction, wherein the second conductor region is directly adjacent to the first conductor region;
in an M1 layer, a third conductor region that extends in a second direction, wherein the second direction is transverse to the first direction;
a drain/source contact that extends in the second direction and overlaps the third conductor region; and
in a VIA0 layer, at least one conductive via that connects the third conductor region to the first conductor region and the second conductor region.

19. The non-transitory computer readable recording medium of claim 18, wherein the layout diagram further comprises:
a first gate electrode region, wherein the first gate electrode region extends in the second direction;
a second gate electrode region, wherein the second gate electrode region extends in the second direction;
a drain/source region adjacent to at least one of the first gate electrode region or the second gate electrode region, the drain/source region under and connected to the drain/source contact;
a first conductive via region that connects the first conductor region to the first gate electrode region; and
a second conductive via that connects the second conductor region to either the second gate electrode region or the drain/source contact.

20. The non-transitory computer readable recording medium of claim 18, wherein
the M0 layer is a metal layer closest to the drain/source contact,
the M1 layer is a metal layer directly adjacent to the M0 layer, and
the VIA0 is a via layer between the M0 layer and the M1 layer.

* * * * *